United States Patent
Lee et al.

(10) Patent No.: US 12,374,575 B2
(45) Date of Patent: Jul. 29, 2025

(54) DEBONDING TAPE AND METHOD OF PROCESSING SEMICONDUCTOR WAFER USING THE SAME

(71) Applicant: Samsung Electronics Co., Ltd., Suwon-si (KR)

(72) Inventors: Seonho Lee, Cheonan-si (KR); Yeongseok Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 807 days.

(21) Appl. No.: 17/677,442

(22) Filed: Feb. 22, 2022

(65) Prior Publication Data

US 2022/0384238 A1 Dec. 1, 2022

(30) Foreign Application Priority Data

May 25, 2021 (KR) .................. 10-2021-0066823

(51) Int. Cl.
*H01L 21/683* (2006.01)
*B32B 27/30* (2006.01)
(Continued)

(52) U.S. Cl.
CPC ........ *H01L 21/6836* (2013.01); *B32B 27/308* (2013.01); *B32B 27/32* (2013.01);
(Continued)

(58) Field of Classification Search
CPC ....... H01L 21/6836; H01L 2221/68327; H01L 21/6835; H01L 2221/68381; H01L 21/78;
(Continued)

(56) References Cited

U.S. PATENT DOCUMENTS

2007/0218651 A1* 9/2007 Higashino ............... H01L 24/83
438/460
2010/0041211 A1* 2/2010 Noda .................. H01L 21/6835
438/464
(Continued)

FOREIGN PATENT DOCUMENTS

JP 2003206457 A * 7/2003 ............. F16K 31/16
JP 2003309088 A * 10/2003 ......... H01L 21/6836
(Continued)

OTHER PUBLICATIONS

Machine translation of JP 2003206457 (Year: 2003).*
(Continued)

*Primary Examiner* — Patricia L. Nordmeyer
(74) *Attorney, Agent, or Firm* — HARNESS, DICKEY & PIERCE, P.L.C.

(57) ABSTRACT

A debonding tape includes a first tape layer including a first base layer having a first modulus and a first adhesive layer on the first base layer, wherein the first tape layer has a first diameter. The debonding tape includes a second tape layer on the first tape layer and supporting the first tape layer, wherein the second tape layer includes a second base layer on the first adhesive layer and having a second modulus greater than the first modulus, an intermediate layer on the second base layer, and a second adhesive layer on the intermediate layer. The second tape layer has a second diameter smaller than the first diameter such that a circumferential portion of the first tape layer is exposed in a cross-sectional view.

20 Claims, 17 Drawing Sheets

(51) Int. Cl.
*B32B 27/32* (2006.01)
*C09J 7/35* (2018.01)
*C09J 7/38* (2018.01)

(52) U.S. Cl.
CPC . *C09J 7/35* (2018.01); *C09J 7/38* (2018.01); *B32B 2457/14* (2013.01); *H01L 2221/68327* (2013.01)

(58) Field of Classification Search
CPC ... B32B 27/308; B32B 27/32; B32B 2457/14; C09J 7/35; C09J 7/38; C09J 2203/334; C09J 2301/502; C09J 2423/006; C09J 2427/006; C09J 2431/006; C09J 2433/00; C09J 2467/006; C09J 2471/006; C09J 2479/086; C09J 7/29; C09J 7/22; C09J 2203/326; C09J 2301/208; C09J 2301/302; C09J 2301/312; C09J 2301/416

See application file for complete search history.

(56) References Cited

U.S. PATENT DOCUMENTS

| | | |
|---|---|---|
| 2014/0205816 A1 | 7/2014 | Maejima |
| 2018/0339497 A1 | 11/2018 | Makino et al. |
| 2020/0219823 A1 | 7/2020 | Unezaki et al. |

FOREIGN PATENT DOCUMENTS

| | | | | |
|---|---|---|---|---|
| JP | 2005011839 A | * | 1/2005 | ......... H01L 21/6836 |
| JP | 2010-056406 A | | 3/2010 | |
| JP | 2012-209385 A | | 10/2012 | |
| JP | 2020-025016 A | | 2/2020 | |
| KR | 20190000828 A | * | 1/2019 | |
| WO | WO-0207962 A1 | * | 1/2002 | ............... B32B 7/12 |
| WO | WO-2020032176 A1 | * | 2/2020 | ............ C09J 201/00 |
| WO | WO-2021074794 A1 | * | 4/2021 | ............... C08K 3/22 |

OTHER PUBLICATIONS

Machine translation of JP 2003309088 (Year: 2003).*
Machine translation of JP 2005011839 (Year: 2005).*
Machine translation of KR 20190000828 (Year: 2019).*
Machine translation of WO 2020032176 (Year: 2020).*

* cited by examiner

FIG. 3 (COMPARATIVE EXAMPLE)

FIG. 4
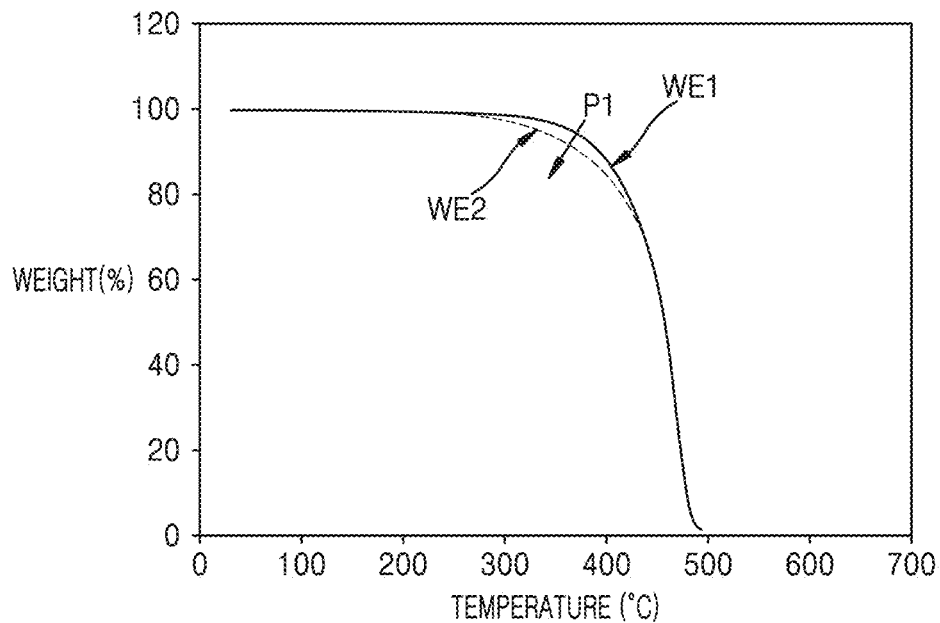
FIG. 5 (COMPARATIVE EXAMPLE)
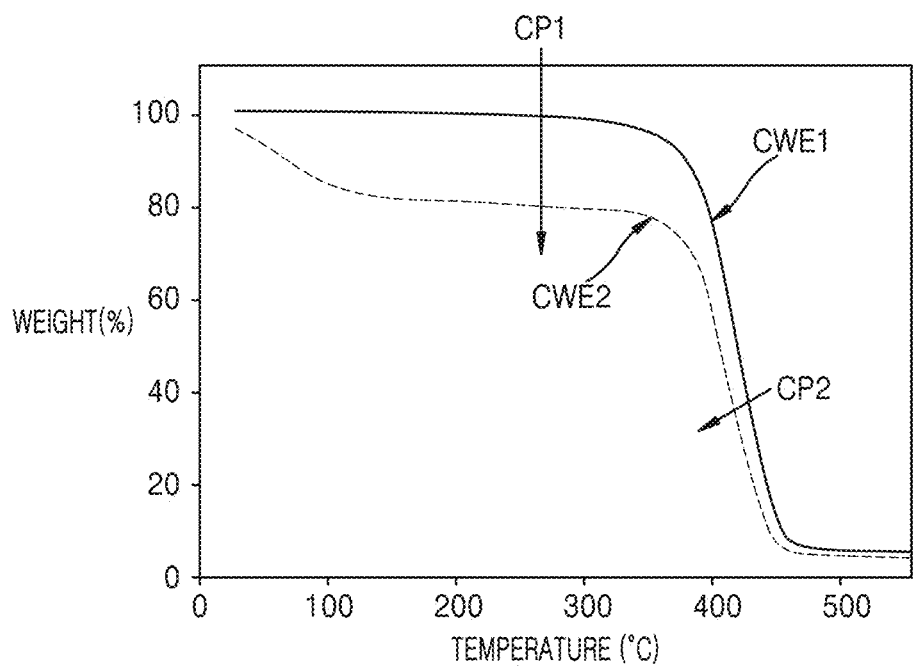

FIG. 8 (COMPARATIVE EXAMPLE)
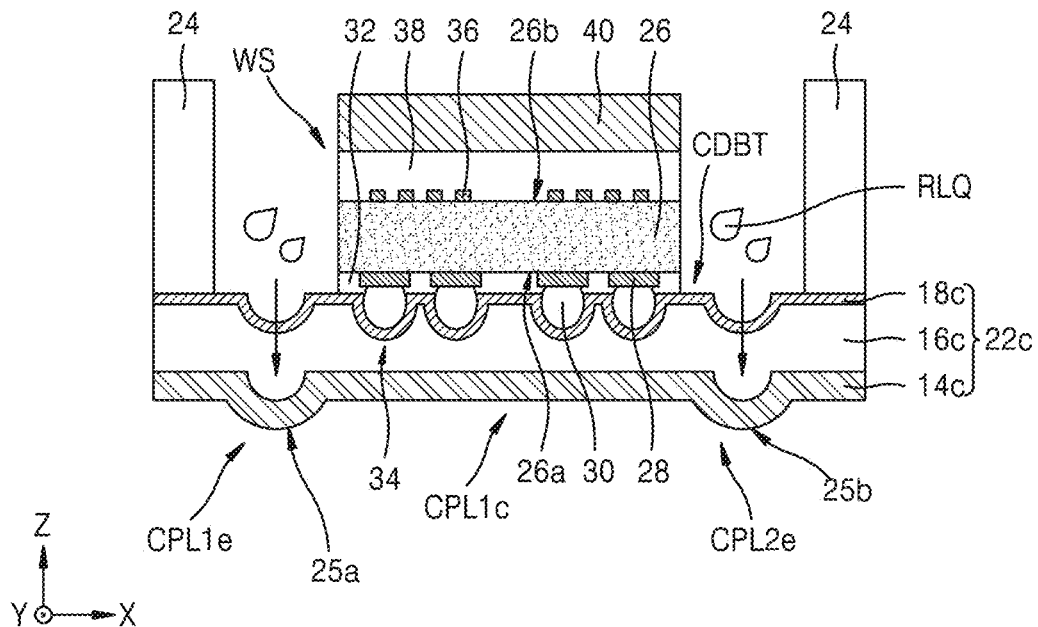
FIG. 9 (COMPARATIVE EXAMPLE)
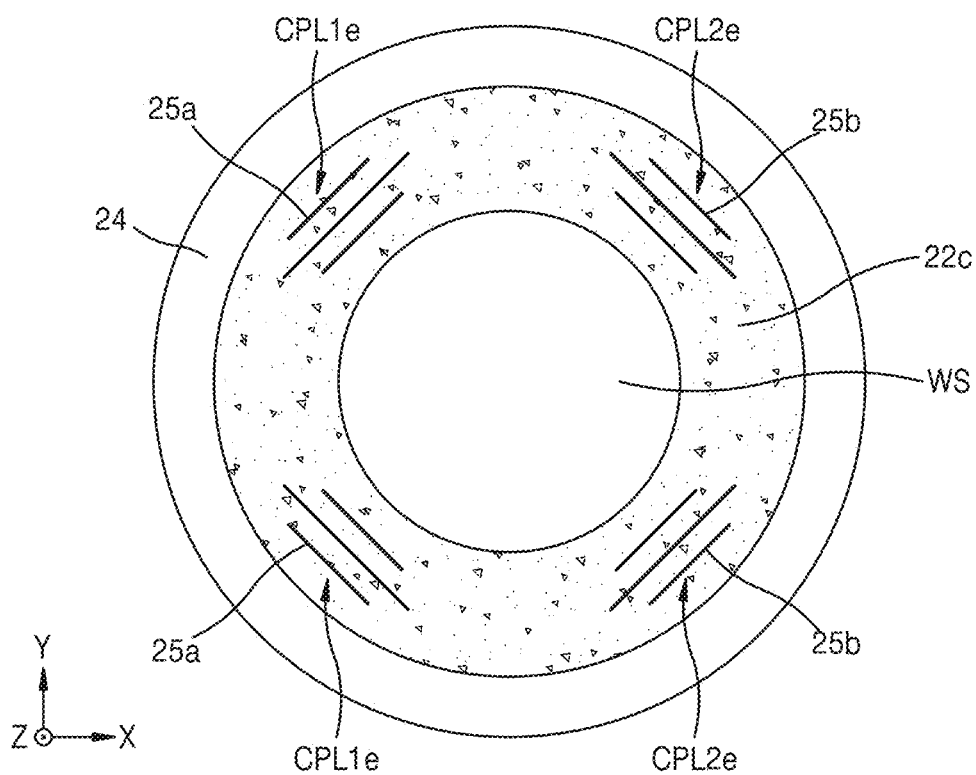

DEBONDING TAPE AND METHOD OF PROCESSING SEMICONDUCTOR WAFER USING THE SAME

CROSS-REFERENCE TO RELATED APPLICATION

This application is based on claims priority under 35 U.S.C. § 119 to Korean Patent Application No. 10-2021-0066823, filed on May 25, 2021, in the Korean Intellectual Property Office, the disclosure of which is incorporated by reference herein in its entirety.

BACKGROUND

The inventive concepts relate to a debonding tape and a method of processing a semiconductor wafer using the same, and more particularly, to a debonding tape and a method of processing a semiconductor wafer using the same that may have improved physical and/or chemical reliability.

The semiconductor wafer may be manufactured into a device wafer through several steps of wafer processing. Because a thickness of the device wafer needs to be as thin as tens of micro meters (μm), for example, about 50 μm to 100 μm, to reduce the thickness of the semiconductor package, a wafer process for reducing the thickness of the semiconductor wafer, for example, a wafer grinding process, may be advantageous.

In addition, because a diameter of the device wafer (or the semiconductor wafer) is hundreds of mm, for example, about 300 mm (12 inches) or about 450 mm (18 inches), in the wafer process, a carrier wafer (or carrier substrate) capable of transporting or handling the device wafer having smaller thickness and/or a larger diameter may be advantageous, and a debonding tape capable of adhering and fixing the device wafer including a carrier wafer may be advantageous. The debonding tape may be separated from the device wafer through a debonding method, and in the wafer process, it may be advantageous that the debonding tape has improved physical and/or chemical reliability.

SUMMARY

The inventive concepts provide a debonding tape having improved physical and/or chemical reliability.

The inventive concepts provide a method of processing a semiconductor wafer using the debonding tape having improved physical and/or chemical reliability.

According to an aspect of the inventive concepts, there is provided a debonding tape including a first tape layer including a first base layer having a first modulus and a first adhesive layer on the first base layer, wherein the first tape layer has a first diameter. The debonding tape includes a second tape layer on the first tape layer and supporting the first tape layer, wherein the second tape layer includes a second base layer on the first adhesive layer and having a second modulus greater than the first modulus, an intermediate layer on the second base layer, and a second adhesive layer on the intermediate layer. The second tape layer has a second diameter smaller than the first diameter such that a circumferential portion of the first tape layer is exposed in a cross-sectional view.

According to another aspect of the inventive concepts, there is provided a debonding tape including a first base layer having a first modulus, a first adhesive layer on the first base layer, a second base layer on the first adhesive layer and having a second modulus greater than the first modulus, an intermediate layer on the second base layer, and a second adhesive layer on the intermediate layer.

According to another aspect of the inventive concepts, there is provided a method of processing a semiconductor wafer, the method including preparing a debonding tape including a first tape layer having a first diameter and a second tape layer adhered on the first tape layer and having a second diameter smaller than the first diameter such that a circumferential portion of the first tape layer is exposed in a cross-sectional view. The first tape layer includes a first base layer having a first modulus and a first adhesive layer on the first base layer, the second tape layer includes a second base layer having a second modulus greater than the first modulus, an intermediate layer on the second base layer, and a second adhesive layer on the intermediate layer.

The method of processing a semiconductor wafer includes mounting the debonding tape on a ring-shaped frame, supporting the circumferential portion of the first tape layer by the ring-shaped frame, and locating the second tape layer in the ring-shaped frame, after turning over the ring-shaped frame, adhering a device wafer, to which a carrier wafer is adhered by a third adhesive layer, to the second adhesive layer of the debonding tape, and debonding and separating the carrier wafer from the device wafer.

The method of processing a semiconductor wafer includes reducing the adhesive force of the debonding tape by exposing the device wafer, to which the debonding tape is adhered, to UV rays, cutting a circumferential portion of the debonding tape, the circumferential portion surrounding the device wafer, turning over the device wafer, to which the cut debonding tape is adhered, and attaching the device wafer to the dicing tape, and debonding and separating the cut debonding tape from the device wafer attached to the dicing tape.

BRIEF DESCRIPTION OF THE DRAWINGS

Example embodiments of the inventive concepts will be more clearly understood from the following detailed description taken in conjunction with the accompanying drawings in which:

FIG. 4 is a graph illustrating a thermogravimetric analysis (TGA) result measured by using the experiment sample of the debonding tape of FIG. 2 according to example embodiments of the inventive concepts;

FIG. 5 is a graph illustrating a TGA result measured by using the comparative experiment sample of the comparative debonding tape of FIG. 3;

FIGS. 8 and 9 are respectively a cross-sectional view and a top-plan view illustrating a wafer structure mounted on the comparative debonding tape;

DETAILED DESCRIPTION OF EXAMPLE EMBODIMENTS

Hereinafter, example embodiments of the inventive concepts will be described in detail with reference to the accompanying drawings. Herein, the drawings are exaggerated to illustrate the inventive concepts more clearly.

Figure 1:
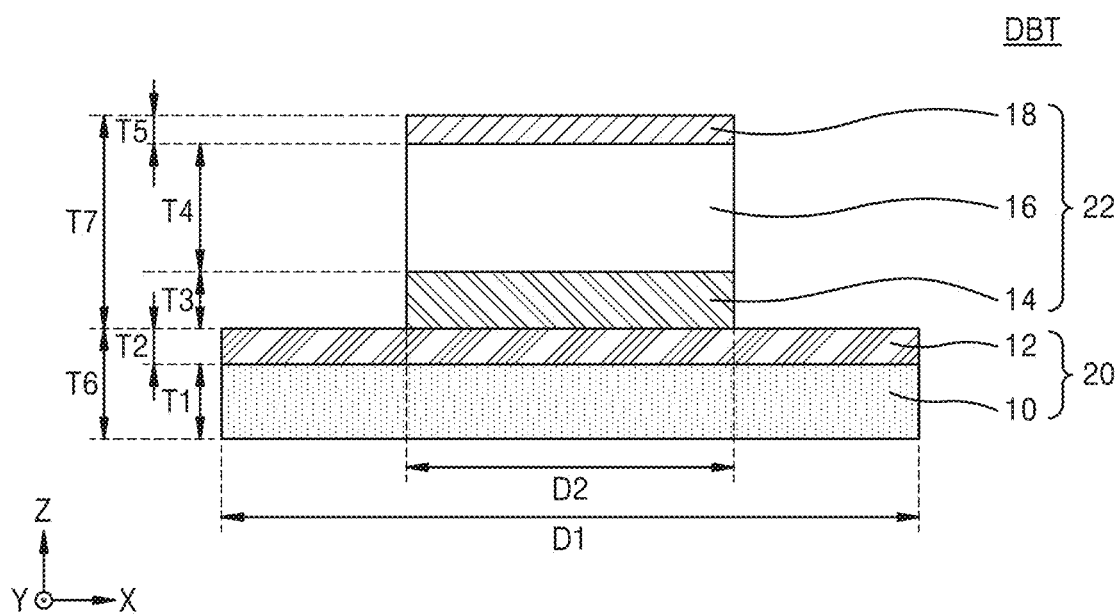
FIG. 1 is a cross-sectional of a debonding tape according to example embodiments of the inventive concepts.

FIG. 1 is a cross-sectional view of a debonding tape according to example embodiments of the inventive concepts.

For example, FIG. 1 may be a cross-sectional view of one side of a debonding tape DBT. The debonding tape DBT may include a first tape layer 20 including a first base layer 10 and a first adhesive layer 12, and a second tape layer 22 including a second base layer 14, an intermediate layer 16, and/or a second adhesive layer 18.

A device wafer to which a carrier wafer is adhered may be mounted on the debonding tape DBT. The device wafer to which the carrier wafer is adhered may be mounted on the second tape layer 22 of the debonding tape DBT. The first tape layer 20 may be a support layer physically supporting the second tape layer 22.

The first tape layer 20 may increase the physical reliability of the debonding tape DBT by supporting the second tape layer 22 in a semiconductor wafer processing process. In addition, the first tape layer 20 may increase the chemical reliability of the debonding tape DBT by reducing or preventing wetting, that is, moisture absorption (penetration or suction of moisture) in the semiconductor wafer processing process, for example, an adhesive layer cleaning process.

The first tape layer 20 may have a first diameter D1. The first diameter D1 may be greater than a diameter of the device wafer. The second tape layer 22 may have a second diameter D2. The second diameter D2 may correspond to the diameter of the device wafer, for example, 300 mm (12 inches) or 450 mm (18 inches).

Here, each of the components included in the debonding tape DBT will be described in detail.

First, the first tape layer 20 included in the debonding tape DBT will be described. The base layer 10 may be referred to as a first base film. The first adhesive layer 12 may be referred to as a first adhesive film. Hereinafter, the term "adhere" may be a comprehensive word including the meaning of 'adhere' and 'bond.' Although 'adhere' and 'bond' may have technically different meanings, "adhere" in the detailed description may include the meaning of both 'adhere' and 'bond.' In addition, hereinafter, the term "attach" may include the meaning of 'adhere' or 'bond.'

The first base layer 10 may include a synthetic resin having a first modulus. The first modulus may be a first Young's modulus. The first base layer 10 may include polyolefin (PO), poly vinyl chloride (PVC), or polyvinyl acetate (PVA). PO may include polypropylene (PP) or polyethylene (PE). The first base layer 10 is not limited to the above materials. The first base layer 10 may have a first thickness T1. In some example embodiments, the first thickness T1 may be about 50 μm to about 200 μm.

The first adhesive layer 12 may be located on the first base layer 10. The first adhesive layer 12 may be formed on the first base layer 10. In some example embodiments, the first adhesive layer 12 may include an ultraviolet (UV) curable pressure sensitive adhesive (PSA). The first adhesive layer 12 may include an acrylic polymer, a cross-linker, and/or a photo initiator.

In some example embodiments, the first adhesive layer 12 may include a non-UV curable PSA. The first adhesive layer 12 may include an acrylic polymer and a cross-linker.

The acrylic polymer may include alkyl acrylate or meta acrylate in which the number of carbon atoms in the monomer composition alkyl group is 4 to 17. The acrylic polymer may include about 50% to about 90% of monomers such as 2-ethylhexyl acrylate (EA), about 10% to about 40% of monomers such as methacrylate, vinyl acetate (VAc), and styrene (ST) as aggregation components, and about 2% to about 20% of monomers such as acrylic acid (AA) and methyl metha acrylic acid (MMA) as functional components.

The cross-linker is not limited as long as it has isocyanate. For example, the cross-linker may be at least one selected from alicyclic compounds such as isophorone diisocyanate and methylenebiscyclohexane diisocyanate, aliphatic compounds such as hexamethylene diisocyanate, and aromatic compounds such as toluene diisocyanate (TDI), methylenediphenyl diisocyanate (MDI), and m-tetramethylxylylene diisocyanate (TMXDI).

The photo initiator may be at least one selected from a benzoin compound, an acetophenone compound, an asilphosphine oxide compound, a titanocene compound, a thioxanthon compound, amine, and quinone. For example, the photo initiator may be 1-hydroxycyclohexyl phenyl ketone, benzoin, benzoin methyl ether, benzoin ethyl ether, benzoin isopropyl ether, benzyl diphenyl sulfide, tetramethylthiuram monosulfide, azobisisobutyronitrile, dibenzyl, diacetyl, and β-chloroanthraquinone, but is not limited thereto.

The first adhesive layer 12 may have a second thickness T2. In some example embodiments, the second thickness T2 may be about 5 μm to about 50 μm. Accordingly, the first tape layer 20 may have a sixth thickness T6. In some example embodiments, the sixth thickness T6 of the first tape layer 20 may be about 55 μm to about 250 μm.

Next, the second tape layer 22 included in the debonding tape DBT will be described. The second base layer 14 may be located on the first adhesive layer 12. The second base layer 14 may be formed on the first adhesive layer 12. The second base layer 14 may be referred to as a second base film.

The second base layer 14 may include a synthetic resin having a second modulus greater than the first modulus. The second modulus may be a second Young's modulus. The second base layer 14 may include polyethylene terephthalate (PET), polyethylene naphthalate (PEN), poly ether ether ketone (PEEK), or polyimide (PI).

The second base layer 14 is not limited to the above materials. The second base layer 14 may have a third thickness T3. The third thickness T3 of the second base layer 14 may be less than the first thickness T1 of the first base layer 10. In some example embodiments, the third thickness T3 may be about 20 μm to about 200 μm.

The intermediate layer 16 may be located on the second base layer 14. The intermediate layer 16 may be formed on the second base layer 14. The intermediate layer 16 may be referred to as an intermediate film. When the device wafer to which the carrier wafer is adhered is mounted on the second tape layer 22 of the debonding tape DBT, the intermediate layer 16 may physically act as a cushion.

The intermediate layer 16 may include a non-UV curable synthetic resin. The intermediate layer 16 may include an acrylic polymer and/or a cross-linker. The acrylic polymer and the cross-linker included in the intermediate layer 16 may be identical to those of the first adhesive layer 12. The intermediate layer 16 is not limited to the above materials.

The intermediate layer 16 may have a fourth thickness T4. The fourth thickness T4 of the intermediate layer 16 may be greater than the third thickness T3 of the second base layer 14. In some example embodiments, the fourth thickness T4 may be about 50 μm to about 300 μm.

The second adhesive layer 18 may be located on the intermediate layer 16. The second adhesive layer 18 may be formed on the intermediate layer 16. In some example embodiments, the second adhesive layer 18 may include a UV curable PSA. The second adhesive layer 18 may include an acrylic polymer, a cross-linker, and/or a photo initiator. The acrylic polymer, the cross-linker, and/or the photo initiator included in the second adhesive layer 18 may be identical to those of the first adhesive layer 12.

The second adhesive layer 18 may have a fifth thickness T5. In some example embodiments, the fifth thickness T5 may be about 5 μm to about 50 μm. Accordingly, the second tape layer 22 may have a seventh thickness T7. In some example embodiments, the seventh thickness T7 of the second tape layer 22 may be about 75 μm to about 550 μm.

In some example embodiments, the debonding tape DBT may be configured such that the sixth thickness T6 of the first tape layer 20 is less than the seventh thickness T7 of the second tape layer 22. The sixth thickness T6 of the first tape layer 20 may be configured to be greater than the seventh thickness T7 of the second tape layer 22 as needed.

In addition, the debonding tape DBT may be configured such that the thicknesses of middle portions of the first tape layer 20 and the second tape layer 22 are greater than the thicknesses of peripheral portions of the first tape layer 20 and the second tape layer 22.

Figure 2:
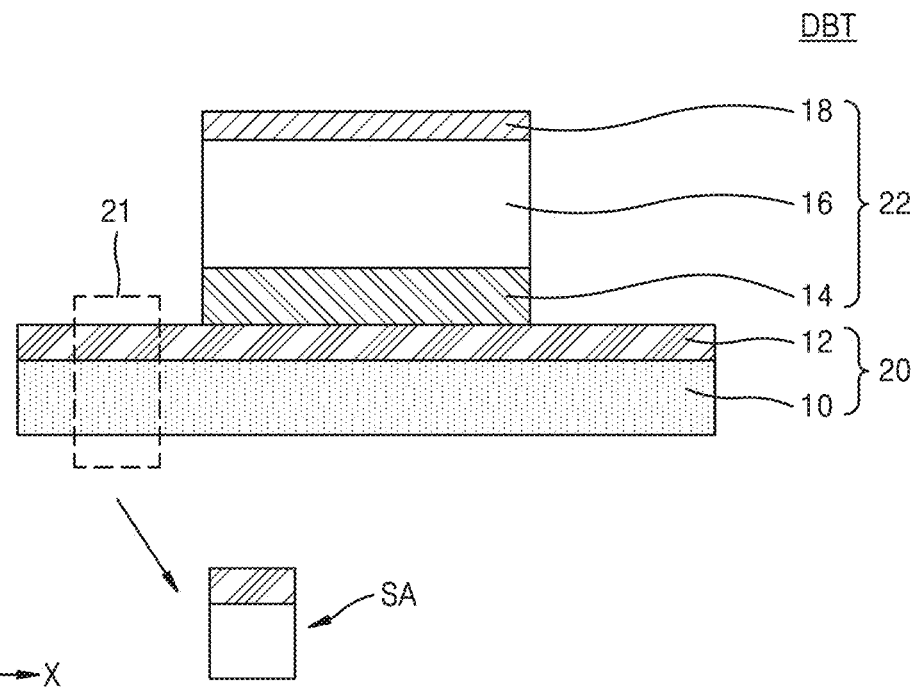
FIG. 2 is a cross-sectional view of an experiment sample for evaluating a chemical characteristic of the debonding tape according to example embodiments of the inventive concepts.
Figure 3:
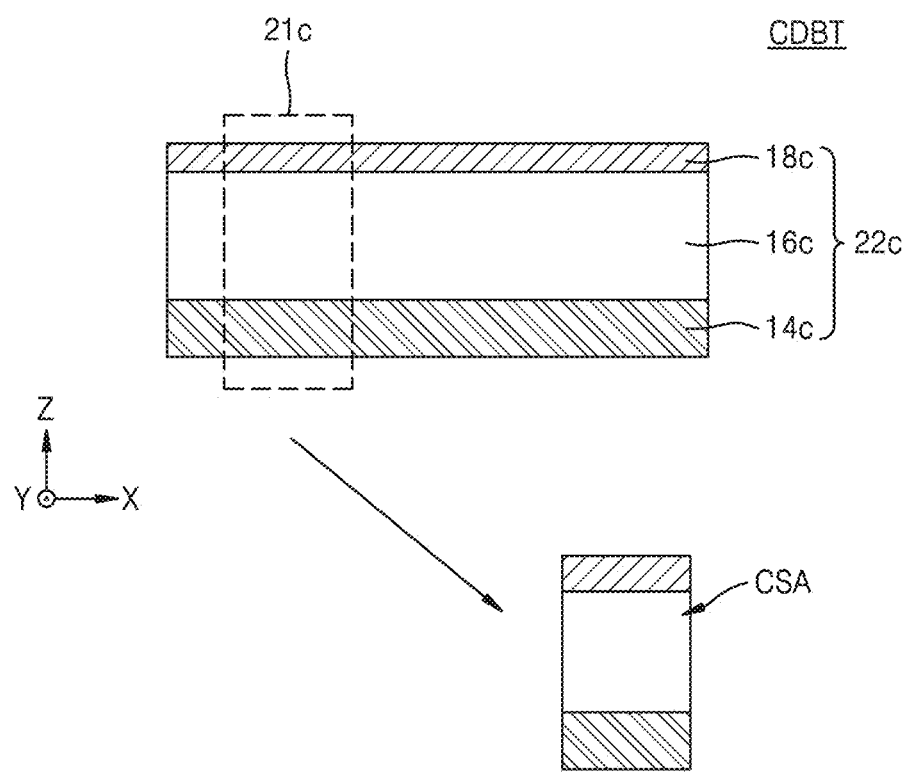
FIG. 3 is a cross-sectional view of a comparative experiment sample of a comparative debonding tape for comparing with FIG. 2.

FIG. 2 is a cross-sectional view of an experiment sample for evaluating a chemical characteristic of the debonding tape DBT according to example embodiments of the inventive concepts, and FIG. 3 is a cross-sectional view of a comparative experiment sample of a comparative debonding tape CDBT for comparing with FIG. 2.

Referring to FIG. 2, the configuration of the debonding tape DBT of FIG. 2 is the same as that of FIG. 1, and therefore, the description thereof is omitted. An experiment sample SA for evaluating the chemical characteristic of the debonding tape DBT is obtained by cutting out a portion of the first tape layer 20 of the debonding tape DBT, as indicated by reference numeral 21.

The experiment sample SA may be the first tape layer 20 including the first base layer 10 and the first adhesive layer 12. The experiment sample SA may be used for evaluating the wetting characteristic, that is, a moisture absorption characteristic of an adhesive eliminating liquid, for example, a tetrabutylammonium fluoride (TBAF), in the semiconductor wafer processing process, for example, the adhesive layer cleaning process.

Referring to FIG. 3, the configuration of the comparative debonding tape CDBT of FIG. 3 corresponds to that of FIG. 2 without the first tape layer 20. The comparative debonding tape CDBT may include a second base layer 14c, an intermediate layer 16c, and a second adhesive layer 18c. The second base layer 14c, the intermediate layer 16c, and the second adhesive layer 18c of FIG. 3 correspond to the second base layer 14, the intermediate layer 16, and the second adhesive layer 18 of FIG. 2, respectively.

A comparative experiment sample CSA for evaluating the chemical characteristic of the comparative debonding tape CDBT is obtained by cutting out a portion of the second tape layer 22c of the comparative debonding tape CDBT, as indicated by reference numeral 21c.

The comparative experiment sample CSA may be the second tape layer 22c including the second base layer 14c, the intermediate layer 16c, and the second adhesive layer 18c. The comparative experiment sample CSA may be used for evaluating the wetting characteristic, that is, the moisture absorption characteristic of the adhesive eliminating liquid, for example, TBAF, in the semiconductor wafer processing process, for example, the adhesive layer cleaning process.

FIG. 4 is a graph illustrating a thermogravimetric analysis (TGA) result measured by using the experiment sample SA of the debonding tape DBT of FIG. 2 according to example embodiments of the inventive concepts, and FIG. 5 is a graph illustrating a TGA result measured by using the comparative experiment sample CSA of the comparative debonding tape CDBT of FIG. 3.

For example, FIG. 4 illustrates the TGA result with regard to the experiment sample SA of FIG. 2 wherein a weight changes in a nitrogen atmosphere according to the temperature change between 30° C. to 600° C. In FIG. 4, WE1 refers to the result with regard to the SA, and WE2 refers to the result with regard to the experiment sample SA exposed to the adhesive eliminating liquid.

As shown in FIG. 4, when the experiment sample SA of the inventive concepts is exposed to the adhesive eliminating liquid, as denoted by WE2, the weight of the experiment sample SA may be slightly reduced at a temperature of 250° C. to 450° C. For example, as indicated by P1 in FIG. 4, it can be seen that a weight reduction of only about 1% occurred even when the experiment sample SA was exposed to the adhesive eliminating liquid.

FIG. 5 illustrates the TGA result with regard to the comparative experiment sample CSA of FIG. 3, wherein a weight changes in a nitrogen atmosphere according to the temperature change between 30° C. to 600° C. In FIG. 5, CWE1 indicates a result with regard to the comparative experiment sample CSA, and CWE2 indicates a result with regard to the comparative experiment sample CSA exposed to the adhesive eliminating liquid.

As shown in FIG. 5, when the comparative experiment sample CSA is exposed to the adhesive eliminating liquid, as indicated by CWE2, the weight of the comparative experiment sample CSA may be reduced at a temperature of 50° C. to 550° C. For example, as indicated by CP1 in FIG. 5, it can be seen that a weight reduction of about 20% occurred at a temperature of around 280° C. when the comparative experiment sample CSA was exposed to the adhesive eliminating liquid. In addition, as indicated by CP2 in FIG. 5, it can be seen that a weight reduction of about 3% around a temperature of 430° C. occurred when the comparative experiment sample CSA was exposed to the adhesive eliminating liquid.

As described above, it can be seen that even when the experiment sample of the debonding tape of the inventive concepts is exposed to the adhesive eliminating liquid, weight is barely reduced. Accordingly, it can be seen that the debonding tape of the inventive concepts has excellent wetting characteristics, that is, moisture absorption characteristic, with regard to the adhesive eliminating liquid. As a result, the debonding tape of the inventive concepts has an improved chemical characteristic.

Figure 6:
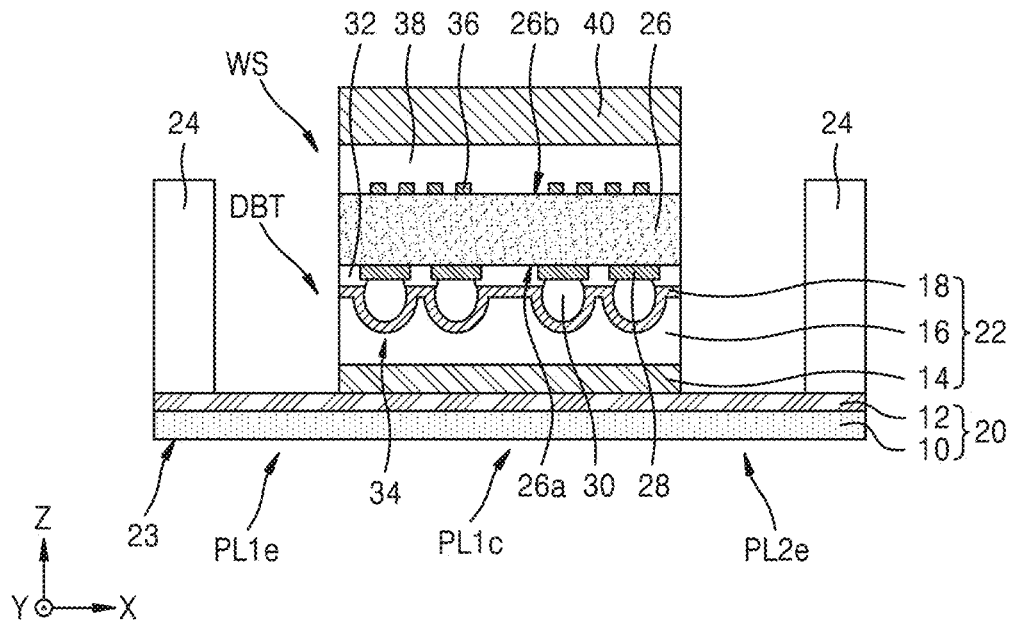
FIGS. 6 and 7 are respectively a cross-sectional view and a top-plan view illustrating a wafer structure mounted on the debonding tape according to example embodiments of the inventive concepts.
Figure 7:
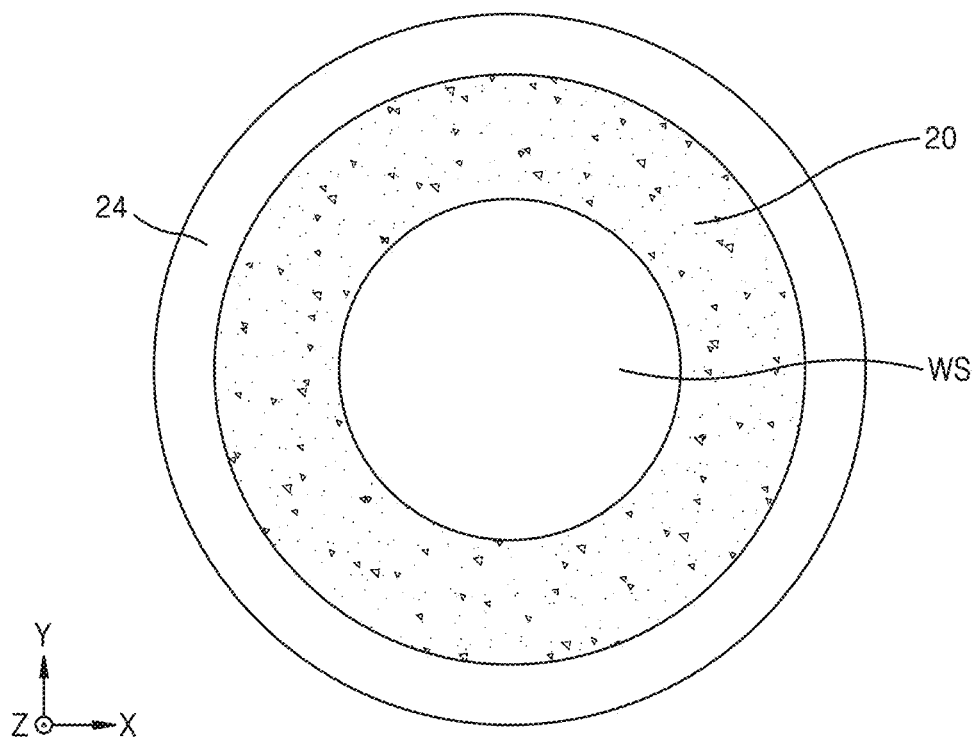

FIGS. 6 and 7 are a cross-sectional view and a top-plan view, respectively, illustrating a wafer structure mounted on the debonding tape according to example embodiments of the inventive concepts.

For example, as illustrated in FIGS. 6 and 7, a wafer structure WS may be mounted on the debonding tape DBT according to example embodiments of the inventive concepts in the wafer process. The wafer structure WS may have a circular shape as shown in FIG. 7.

The configuration and effect of the debonding tape DBT are described with reference to FIGS. 1, 2, and 4, and therefore, redundant description therewith is omitted. In FIGS. 6 and 7, the same reference numerals as those in FIGS. 1 and 2 may denote the same members, and the same descriptions as those of FIGS. 1 and 2 are briefly given or omitted.

The wafer structure WS may include a device wafer 26 to which a carrier wafer 40 is adhered. In some example embodiments, the carrier wafer 40 may include silicon or glass. The device wafer 26 may include an interposer wafer (or interposer substrate) or a chip wafer. The interposer wafer may include a wafer in which an integrated circuit is not formed and only a wiring layer is formed therein. The chip wafer may include a wafer in which an integrated circuit is formed.

The device wafer 26 may include a first surface 26*a* and a second surface 26*b* opposite to the first surface 26*a*. The first surface 26*a* and the second surface 26*b* may be a front surface and a rear surface, respectively. A plurality of first wiring pads 28 and a plurality of solder bumps 30 (or solder balls) may be arranged on the first surface 26*a*. A passivation layer 32 may be formed between the first wiring pads 28 on the first surface 26*a* as needed. A plurality of second wiring pads 36 may be arranged on the second surface 26*b*.

The carrier wafer 40 may be adhered to the second surface 26*b* of the device wafer 26 with a third adhesive layer 38 therebetween. The third adhesive layer 38 may include a thermal curable adhesive layer including polydimethylsiloxane (PDMS). After laminating the device wafer 26 and the carrier wafer 40, heat may be applied thereto, resulting in the device wafer 26 being adhered to the carrier wafer 40 using the third adhesive layer 38.

The carrier wafer 40 is adhered for the wafer process or handling of the device wafer 26. For example, the carrier wafer 40 is adhered for a wafer process for reducing the thickness of the device wafer 26, for example, a wafer grinding process.

The device wafer 26 to which the carrier wafer 40 is adhered may be mounted on the debonding tape DBT adhered to a ring-shaped frame 24. The wafer structure WS including the device wafer 26 to which the carrier wafer 40 is adhered may be adhered in the ring-shaped frame 24. The second tape layer 22 of the debonding tape DBT may be located in the ring-shaped frame 24. As illustrated in FIG. 6, the circumferential portion of the first tape layer 20 of the debonding tape DBT may be supported by the lower portion of the ring-shaped frame 24.

The device wafer 26 to which the carrier wafer 40 is adhered may be mounted on the second tape layer 22 of the debonding tape DBT. When adhering, to the second adhesive layer 18 of the debonding tape DBT, the device wafer 26 to which the carrier wafer 40 is adhered, a plurality of solder bumps 30 formed on the device wafer 26 may be adhered to the second adhesive layer 18. The solder bumps 30 may include connection terminals for connecting to external electronic components. Diameters of the solder bumps 30 may be about 50 µm to about 100 µm.

When adhering the device wafer 26 to which the carrier wafer 40 is adhered to the second adhesive layer 18 of the debonding tape DBT, the plurality of solder bumps 30 may be heavy and, as illustrated by reference numeral 34, may impregnate (penetrate) into the intermediate layer 16 and the second adhesive layer 18 may have an elliptical shape.

After adhering, to the second adhesive layer 18 of the debonding tape DBT, the device wafer 26 to which the carrier wafer 40 is adhered, through the support of the first tape layer 20, the debonding tape DBT may not sink down. In other words, even after adhering the device wafer 26 to which the carrier wafer 40 is adhered to the second adhesive layer 18 of the debonding tape DBT, circumferential portions PL1*e* and PL2*e* of the debonding tape DBT, that is, the circumferential portions PL1*e* and PL2*e* of the first tape layer 20, may not sink down.

In addition, a middle portion PL1*c* and the circumferential portions PL1*e* and PL2*e* of the debonding tape DBT may have a flat surface 23 in a lower portion thereof. In other words, the middle portion PL1*c* and the circumferential portions PL1*e* and PL2*e* of the first tape layer 20 included in the debonding tape DBT may have a flat surface 23 in the lower portion thereof. Accordingly, the debonding tape DBT of the inventive concepts may have excellent physical characteristic because the debonding tape DBT does not sink down even when the device wafer 26 to which the carrier wafer 40 is adhered is mounted thereon.

The device wafer 26 adhered on the second tape layer 22 of the debonding tape DBT may be cleaned in the wafer process. Even when the device wafer 26 adhered on the second tape layer 22 of the debonding tape DBT is cleaned, as described above, because the second tape layer 22 has good wetting characteristics, moisture may not penetrate thereinto. Accordingly, the debonding tape DBT may have excellent chemical characteristic.

FIGS. 8 and 9 are a cross-sectional view and a top-plan view, respectively, illustrating the wafer structure mounted on the comparative debonding tape.

For example, the wafer structure WS may be mounted on the comparative debonding tape CDBT in the wafer process, as illustrated in FIGS. 8 and 9. Because the wafer structure WS is illustrated in FIGS. 6 and 7, redundant descriptions therewith are omitted.

In addition, because the configuration and disadvantages of the comparative debonding tape CDBT have been described with respect to FIGS. 3 and 5, redundant description therewith are omitted. In FIGS. 8 and 9, the same reference numerals as those in FIG. 3 may denote the same members, and the same descriptions as those of FIG. 3 are briefly given or omitted.

The device wafer 26 to which the carrier wafer 40 is adhered may be mounted on the comparative debonding tape CDBT adhered to the ring-shaped frame 24. The wafer structure WS including the device wafer 26 to which the carrier wafer 40 is adhered may be adhered in the ring-shaped frame 24. The second tape layer 22c of the comparative debonding tape CDBT may be located in the ring-shaped frame 24. As illustrated in FIG. 8, the circumferential portion of the second tape layer 22c of the comparative debonding tape CDBT may be supported on the lower portion of the ring-shaped frame 24. Regarding FIG. 8, the ring-shaped frame 24 adheres the second tape layer 22c and the solder bumps 30 exert pressure to the second tape layer 22c, and thus weak portions of the second tape layer 22c protrude out to form the curved surfaces 25a and 25b.

The device wafer 26 to which the carrier wafer 40 is adhered may be mounted on the second tape layer 22c of the comparative debonding tape CDBT. When adhering the device wafer 26 to which the carrier wafer 40 is adhered to the second adhesive layer 18c of the comparative debonding tape CDBT, the plurality of solder bumps 30 formed in the device wafer 26 may be adhered to the second adhesive layer 18c.

When adhering the device wafer 26 to which the carrier wafer 40 is adhered to the second adhesive layer 18c of the comparative debonding tape CDBT, the plurality of solder bumps 30 may be heavy and, as illustrated by reference numeral 34, may impregnate (penetrate) into the intermediate layer 16 and the second adhesive layer 18c may have an elliptical shape.

After adhering the device wafer 26 to which the carrier wafer 40 is adhered to the second adhesive layer 18c of the comparative debonding tape CDBT, the comparative debonding tape CDBT may sink down. In other words, after adhering the device wafer 26 to which the carrier wafer 40 is adhered on the second adhesive layer 18c of the comparative debonding tape CDBT, the circumferential portions CPL1e and CPL2e of the comparative debonding tape CDBT may sink down. In the comparative debonding tape CDBT, the lower portion of the circumferential portions CPL1e and CPL2e may have curved surfaces 25a and 25b. In other words, in the comparative debonding tape CDBT, the lower portion of the middle portion CPL1c and the circumferential portions CPL1e and CPL2e may not be flat.

The device wafer 26 adhered on the comparative debonding tape CDBT may be cleaned in the wafer process. When the device wafer 26 adhered on the comparative debonding tape CDBT is cleaned, because the wetting characteristic of the comparative debonding tape CDBT is poor as described above, as indicated by arrows, an adhesive eliminating liquid RLQ may penetrate into the comparative debonding tape CDBT. When the adhesive eliminating liquid RLQ penetrates into the comparative debonding tape CDBT, the comparative debonding tape CDBT may sink down even more, and the wafer process may become difficult.

FIGS. 10A, 10B, 11A, 11B, 12A, 12B, 13A, and 13B are diagrams of a method of manufacturing a debonding tape, according to example embodiments of the inventive concepts.

For example, FIGS. 10A, 11A, 12A, and 13A are plan views of a debonding tape, and FIGS. 10B, 11B, 12B, and 13B are cross-sectional views of FIGS. 10A, 11A, 12A, and 13A, respectively.

In FIGS. 10A, 10B, 11A, 11B, 12A, 12B, 13A, and 13B, the same reference numerals as those in FIG. 1 may denote the same members. In FIGS. 10A, 10B, 11A, 11B, 12A, 12B, 13A, and 13B, the same descriptions as those of FIG. 1 are briefly given or omitted.

Figure 10A:
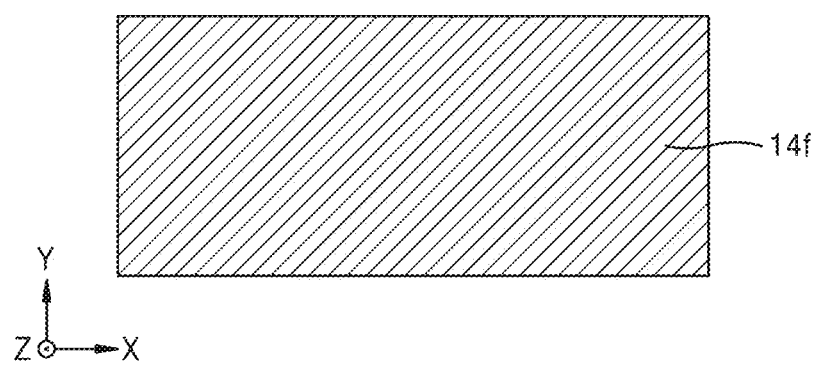
FIGS. 10A, 10B, 11A, 11B, 12A, 12B, 13A, and 13B are diagrams of a method of manufacturing a debonding tape, according to example embodiments of the inventive concepts.
Figure 10B:
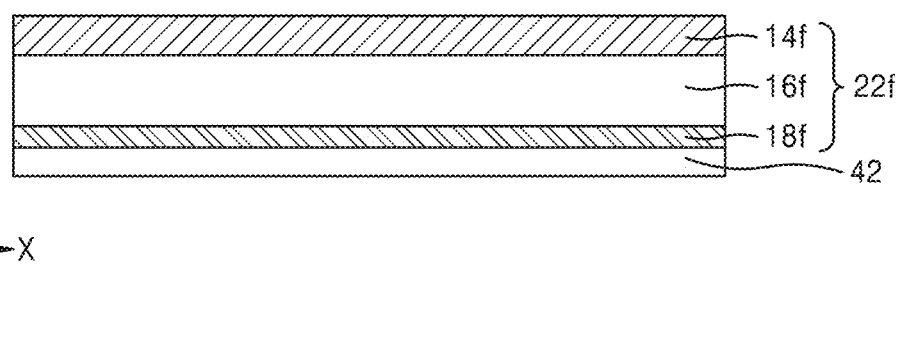

Referring to FIGS. 10A and 10B, a second adhesive material layer 18f, an intermediate material layer 16f, and a second base material layer 14f may be formed on a cover layer 42. The cover layer 42 may include a synthetic resin, for example, polyethylene terephthalate (PET). Because FIG. 10A is a plan view, only the second base material layer 14f may be illustrated.

The second adhesive material layer 18f, the intermediate material layer 16f, and the second base material layer 14f may be formed to the second adhesive layer 18, intermediate layer 16, and second base layer 14, respectively, in a post-process, as described previously. The constituent materials of the second adhesive material layer 18f, the intermediate material layer 16f, and the second base material layer 14f are the same as those of the previous descriptions and thus are omitted.

Figure 11A:
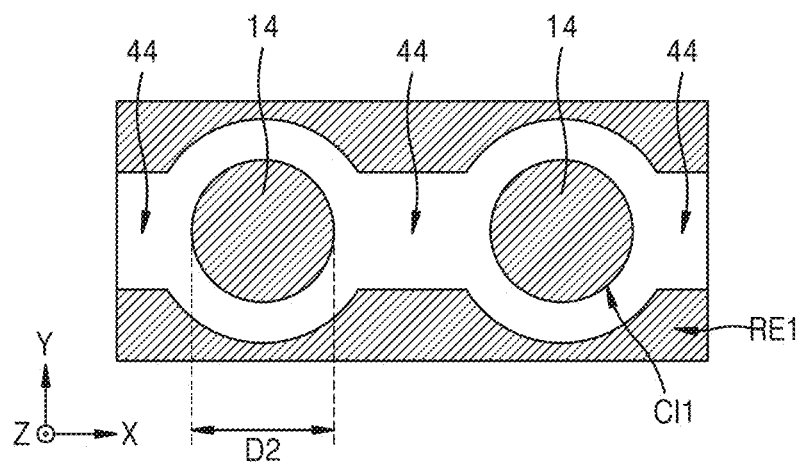
Figure 11B:
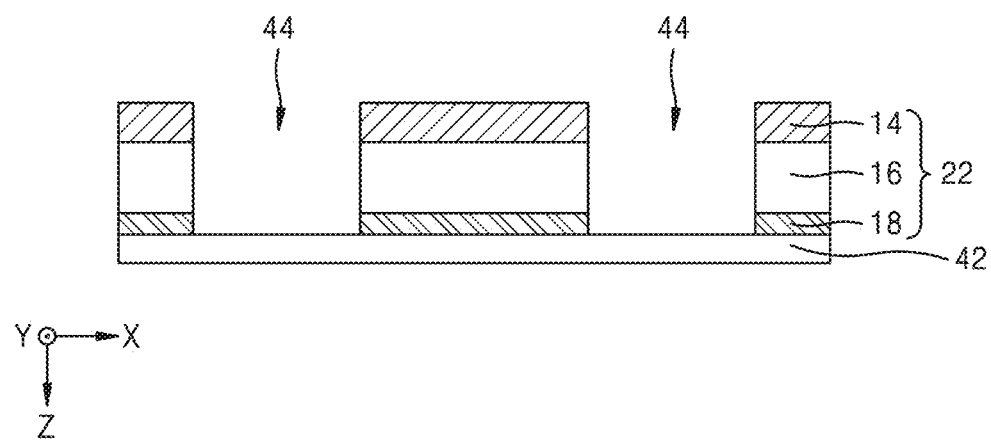

Referring to FIGS. 11A and 11B, by selectively punching (or eliminating) the second base material layer 14f, the intermediate material layer 16f, and the second adhesive material layer 18f using a cutting or punching apparatus, the second base layer 14, the intermediate layer 16, and the second adhesive layer 18 may be formed.

Accordingly, the second tape layer 22 including the second adhesive layer 18, the intermediate layer 16, and the second base layer 14 may be formed on the cover layer 42. A first opening layer 44 may be formed between the second tape layers 22.

In the top-plan view of FIG. 11A, only the second base layer 14 and the first opening layer 44 may be illustrated. The second base layer 14 may include a first circular portion CI1 and a first remaining portion RE1. The first circular portion CI1 may correspond to the second tape layer 22 in a cross-sectional view of FIG. 11B. The first circular portion CI1 may be a portion on which the device wafer 26 is mounted in the wafer process. The first circular portion CI1 may have a second diameter D2.

Figure 12A:
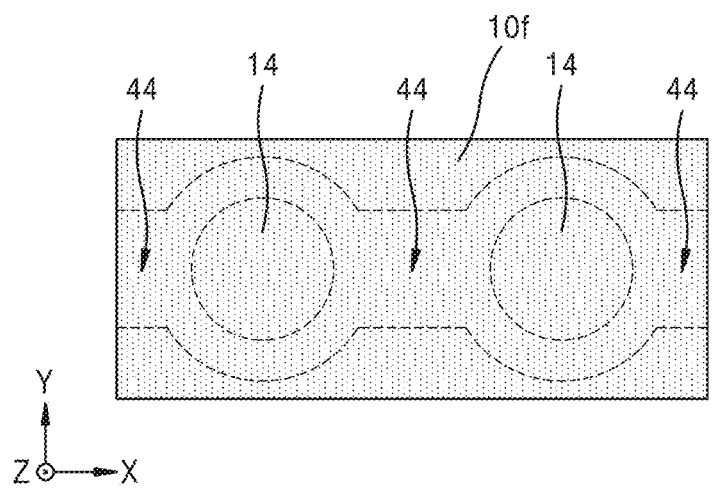
Figure 12B:
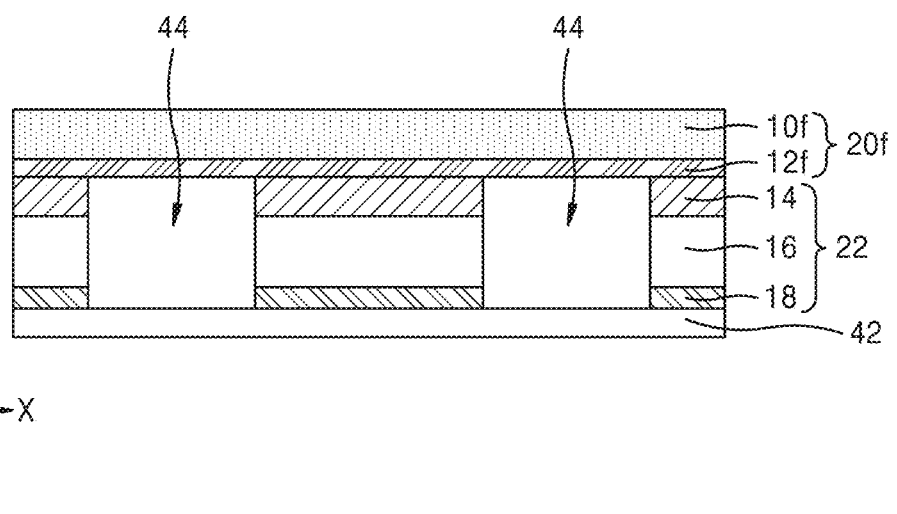

Referring to FIGS. 12A and 12B, a first tape material layer 20f may be formed on the first opening layer 44 and the second tape layer 22. A first adhesive material layer 12f and a first base material layer 10f may be formed sequentially on the second tape layer 22.

The first tape material layer 20f may be formed on the second base layer 14 while covering the first opening layer 44. When the first tape material layer 20f is formed, the first opening layer 44 may remain under the first tape material layer 20f.

The first adhesive material layer 12f and the first base material layer 10f may be formed to the first adhesive layer 12 and the first base layer 10, respectively, described previously, in a post-process. The first adhesive material layer 12f and the first base material layer 10f are the same as those of the previous descriptions and thus are omitted.

The first base material layer 10f may be illustrated in the top-plan view of FIG. 12A. In the top-plan view of FIG. 12A, the second base layer 14 and the first opening layer 44 may be illustrated by dashed lines.

Figure 13A:
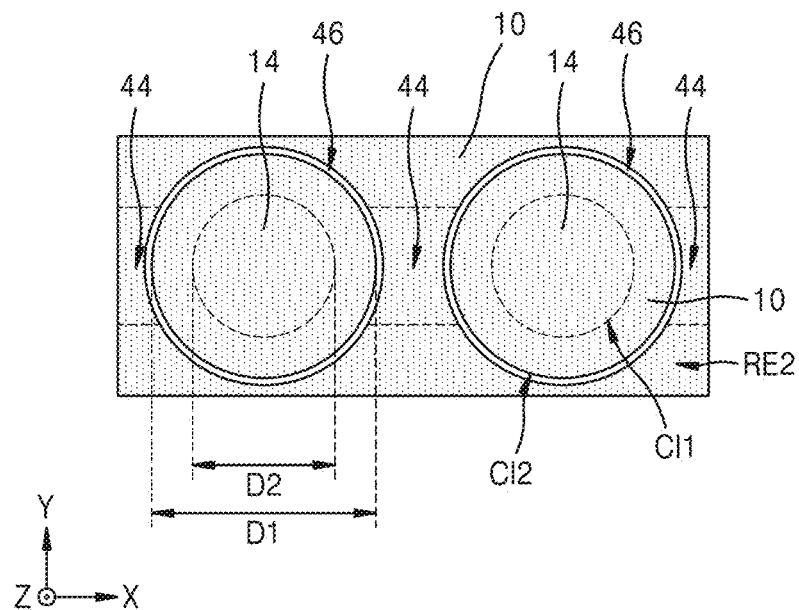
Figure 13B:
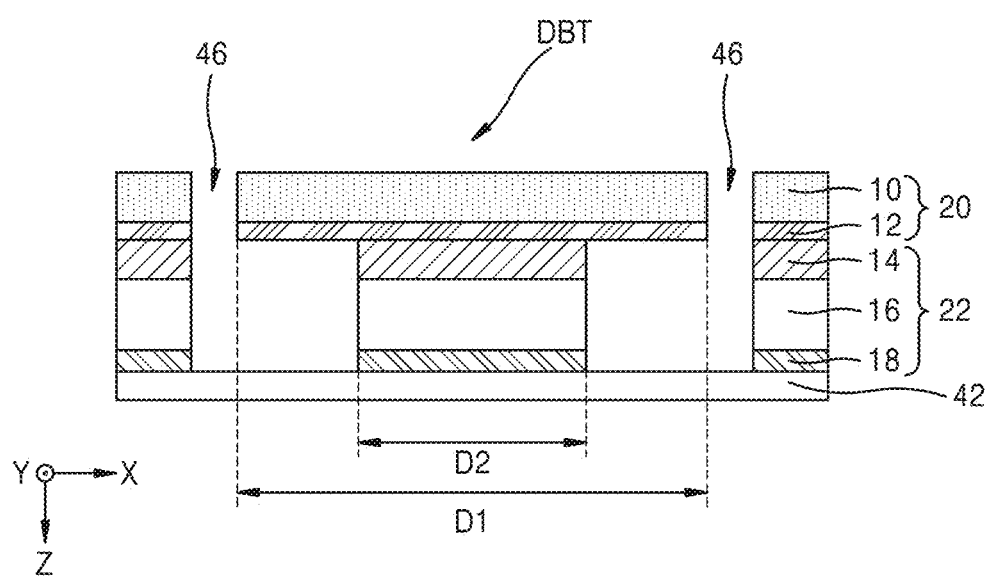

Referring to FIGS. 13A and 13B, by selectively punching (or eliminating) the first base material layer 10f and the first adhesive material layer 12f using a cutting or punching apparatus, the first base layer 10 and the first adhesive layer 12 may be formed.

Accordingly, the first tape layer 20 including the first adhesive layer 12 and the first base layer 10 may be formed on the second base layer 14. A second opening layer 46 may be formed between the first tape layers 20. The second opening layer 46 may be communicated with the first opening layer 44. The second tape layer 22 may be manufactured under the first tape layer 20. The second tape layer 22 having the second diameter D2 and the first tape layer 20 having the first diameter D1, which is greater than the second diameter D2, may be sequentially manufactured on the cover layer 42.

In the top-plan view of FIG. 13A, the first base layer 10 and the second opening layer 46 may be illustrated. The first base layer 10 may include a second circular portion CI2 and a first remaining portion RE2. The second circular portion CI2 may correspond to the first tape layer 20 in the cross-sectional view of FIG. 13B. The second circular portion CI2 may have the first diameter D1, which is greater than the second diameter D2.

The second circular portion CI2 may be a portion on which the device wafer 26 is mounted in the wafer process. The second circular portion CI2 may be a support layer supporting the second tape layer 22 in the wafer process. In the top-plan view of FIG. 13A, the second base layer 14, the first circular portion CI1, and the first opening layer 44 may be illustrated by dashed lines. Subsequently, the debonding tape DBT may be manufactured by eliminating the cover layer 42 illustrated in FIG. 13B.

FIGS. 14A to 14G are cross-sectional views of a method of processing a semiconductor wafer by using a debonding tape according to example embodiments of the inventive concepts.

Figure 14A:
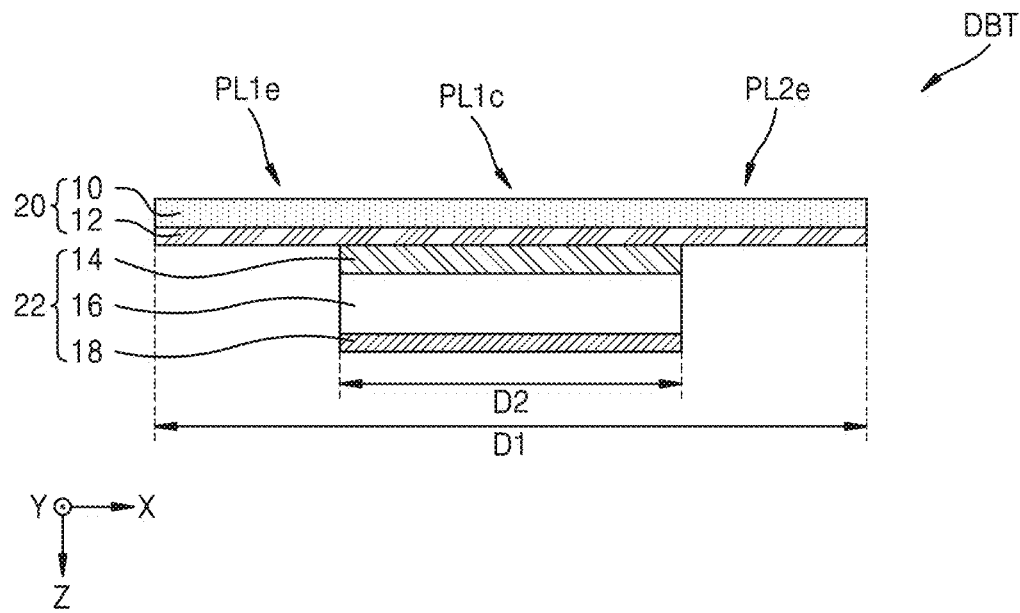
FIGS. 14A through 14G are cross-sectional views of a method of processing a semiconductor wafer, by using a debonding tape according to the inventive concepts, according to example embodiment of the inventive concepts.

Referring to FIG. 14A, the debonding tape DBT according to the inventive concepts may be prepared. The debonding tape DBT may be manufactured according to the descriptions of FIGS. 10A, 10B, 11A, 11B, 12A, 12B, 13A, and 13B. FIG. 14A illustrates the debonding tape DBT of FIG. 13B from which the cover layer 42 is removed.

When the debonding tape DBT of FIG. 14A is turned over, it may be the debonding tape DBT illustrated in FIG. 1. In FIG. 14A, the same reference numerals as those in FIG. 1 may denote the same members. In FIG. 14A, the same descriptions as those of FIG. 1 are briefly given or omitted.

As described above, in the debonding tape DBT, the first tape layer 20 having the first diameter D1, which is greater than the second diameter D2, may be located on the second tape layer 22 having the second diameter D2. The debonding tape DBT may include the middle portion PL1c and the circumferential portions PL1e and PL2e. The circumferential portions PL1e and PL2e of the debonding tape DBT, that is, the circumferential portions PL1e and PL2e of the first tape layer 20, may be exposed in a cross-sectional view.

Figure 14B:
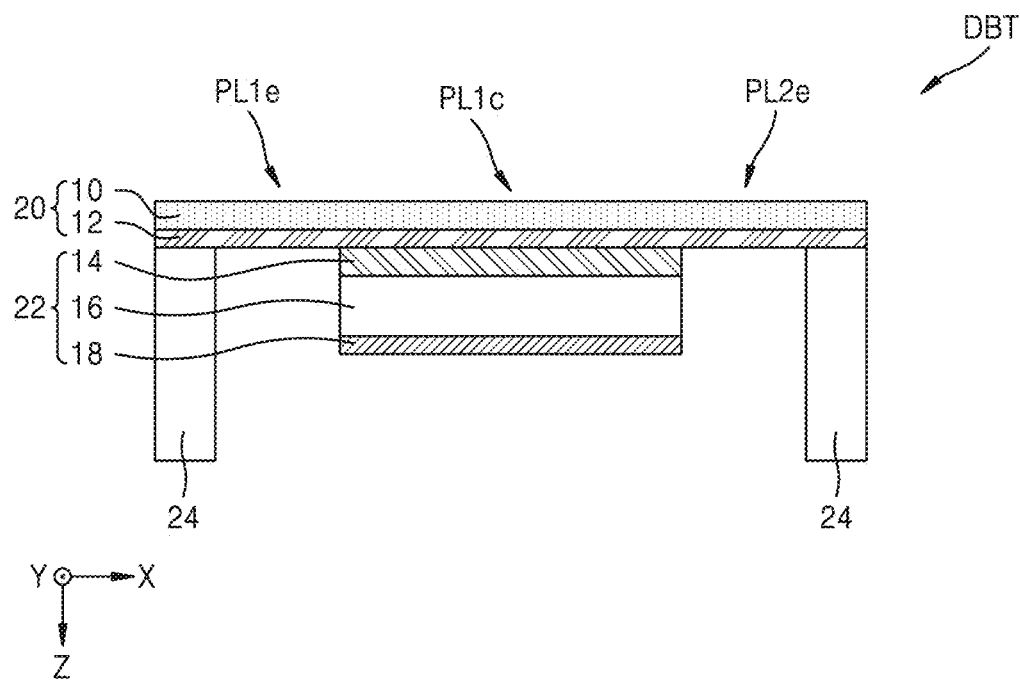

Referring to FIG. 14B, the debonding tape DBT may be mounted in the ring-shaped frame 24. The circumferential portions PL1e and PL2e of the first tape layer 20 of the debonding tape DBT may be supported by an upper portion of the ring-shaped frame 24. In other words, the circumferential portions PL1e and PL2e of the first tape layer 20 included in the debonding tape DBT may be supported by the ring-shaped frame 24, and the second tape layer 22 may be located in the ring-shaped frame 24.

Figure 14C:
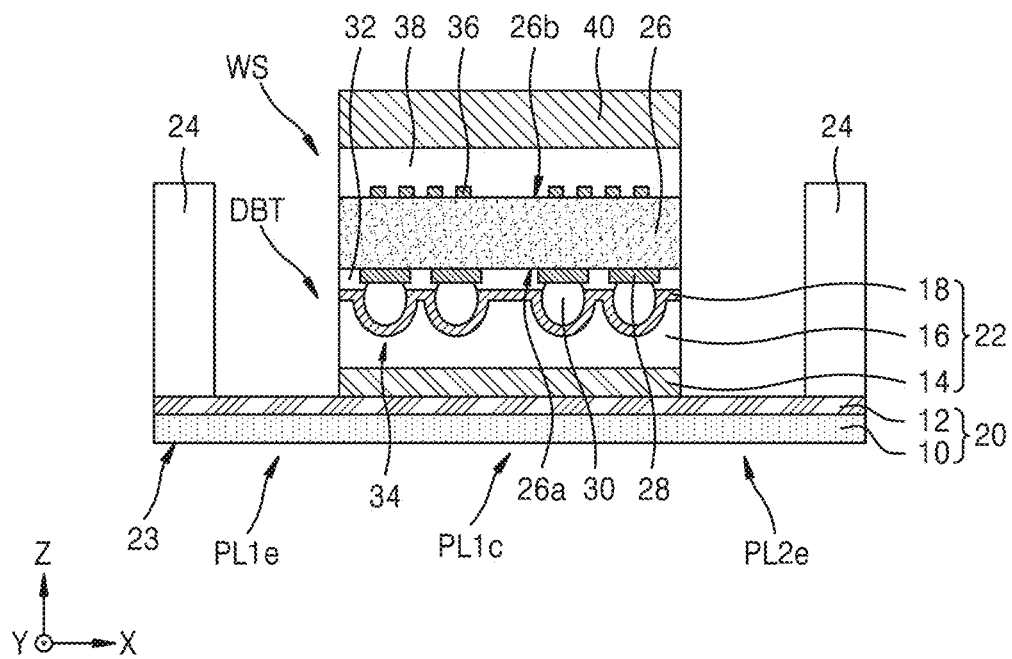

Referring to FIG. 14C, after turning over the ring-shaped frame 24 of FIG. 14B, the wafer structure WS including the device wafer 26 to which the carrier wafer 40 is adhered may be mounted on the second adhesive layer 18 of the debonding tape DBT. The device wafer 26 to which the carrier wafer 40 is adhered may be mounted on the second adhesive layer 18 of the debonding tape DBT.

As described above, when adhering, on the second adhesive layer 18 of the debonding tape DBT, the device wafer 26 to which the carrier wafer 40 is adhered, the plurality of solder bumps 30 may be heavy and, as illustrated by reference numeral 34, may impregnate (penetrate) into the intermediate layer 16 and the second adhesive layer 18 may have an elliptical shape.

As described above, adhering the device wafer 26 to which the carrier wafer 40 is adhered on the second adhesive layer 18 of the debonding tape DBT may be performed such that the circumferential portions PL1e and PL2e of the debonding tape DBT, that is, the circumferential portions PL1e and PL2e of the first tape layer 20, may not sink down. In addition, the middle portion PL1c and the circumferential portions PL1e and PL2e of the debonding tape DBT may have a flat surface 23 in a lower portion thereof.

The wafer structure WS including the device wafer 26, to which the carrier wafer 40 is adhered, and being mounted on the second adhesive layer 18 of the debonding tape DBT is described with reference to FIGS. 6 and 7, and therefore, detailed description thereof is omitted.

Figure 14D:
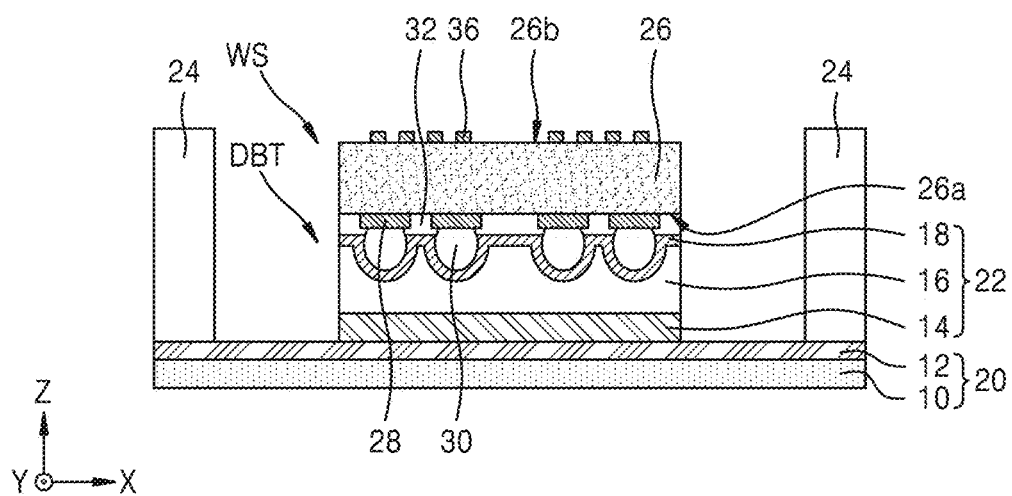
Figure 14E:
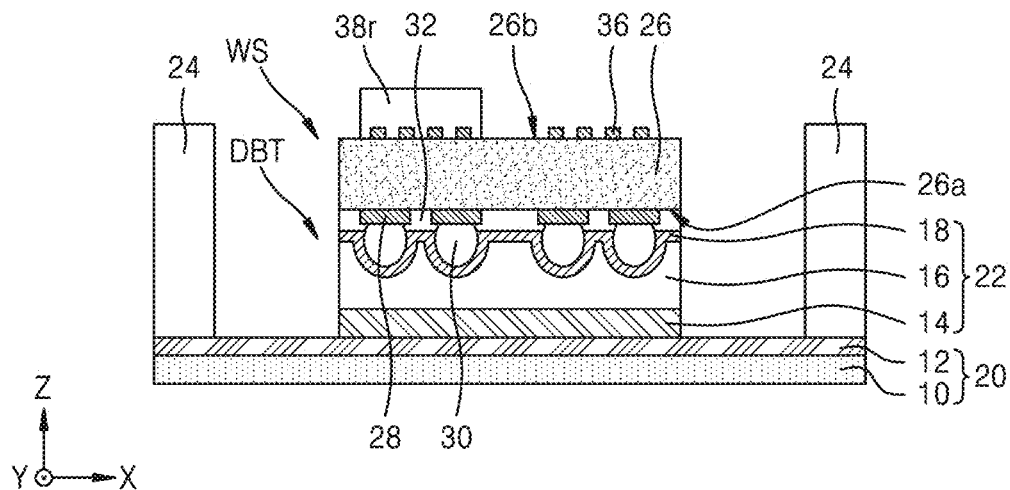

Referring to FIGS. 14D and 14E, the carrier wafer (with reference numeral of 40 in FIG. 14c) may be debonded and separated from the device wafer 26 as illustrated in FIG. 14D. Heat may be applied to the device wafer 26 and the carrier wafer 40 to reduce the adhesive force of the third adhesive layer 38 and debond and separate the carrier wafer 40 from the device wafer 26. In this way, the wafer structure WS including the device wafer 26 may be adhered on the debonding tape DBT.

After the carrier wafer 40 (with reference numeral of 40 in FIG. 14C) is debonded and separated from the device wafer 26, as illustrated in FIG. 14E, to remove an adhesive material 38r remaining on the device wafer 26, for example, polydimethylsiloxane (PDMS) polymer, the device wafer 26 adhered on the second tape layer 22 of the debonding tape DBT may be cleaned.

The adhesive material 38r remaining on the device wafer 26 may be removed by cleaning using an adhesive eliminating liquid, for example, TBAF. As described above, even when the device wafer 26 adhered on the second tape layer 22 of the debonding tape DBT is cleaned, the second tape layer 22 has good wetting characteristics, and thus, moisture may not penetrate into the second tape layer 22.

Figure 14F:
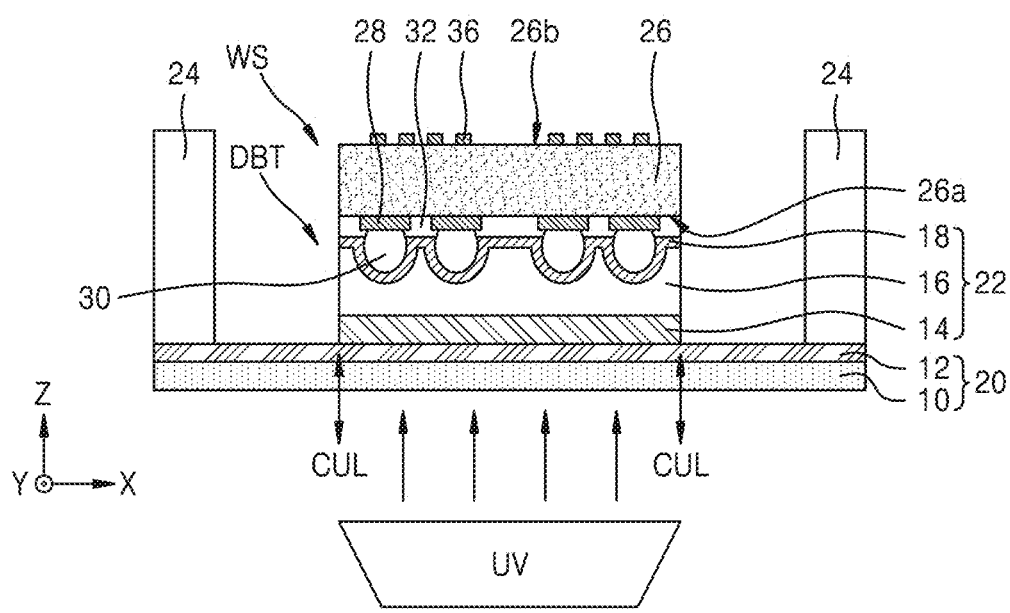

Referring to FIG. 14F, the device wafer 26 adhered on the debonding tape DBT may be exposed to UV rays to reduce the adhesive force (or bonding force) of the debonding tape DBT. The wafer structure WS adhered on the debonding tape DBT may be exposed to UV rays to reduce the adhesive force of the debonding tape DBT. Subsequently, as indicated by CUL, the circumferential portion of the debonding tape DBT surrounding the device wafer 26 may be cut.

Figure 14G:
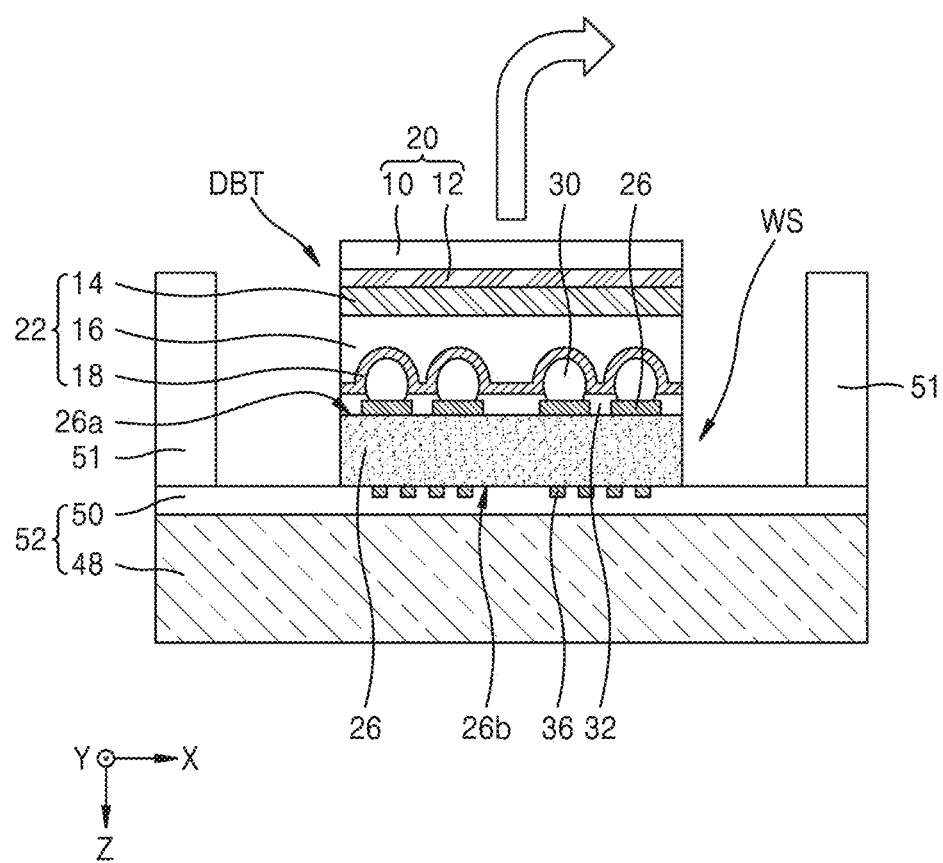

Referring to FIG. 14G, the device wafer 26 to which the debonding tape DBT is adhered may be turned over and attached to a dicing tape 52. The dicing tape 52 may be attached on a ring-shaped frame for dicing 51. The dicing tape 52 includes a base layer 48 and an adhesive layer 50. The device wafer 26 to which the cut DBT is adhered may be adhered to the adhesive layer 50.

The cut debonding tape DBT is debonded and separated from the device wafer 26 attached to the dicing tape 52. Subsequently, the device wafer 26 attached to the dicing tape 52 may be cut, thereby manufacturing a plurality of semiconductor chips.

Figure 15:
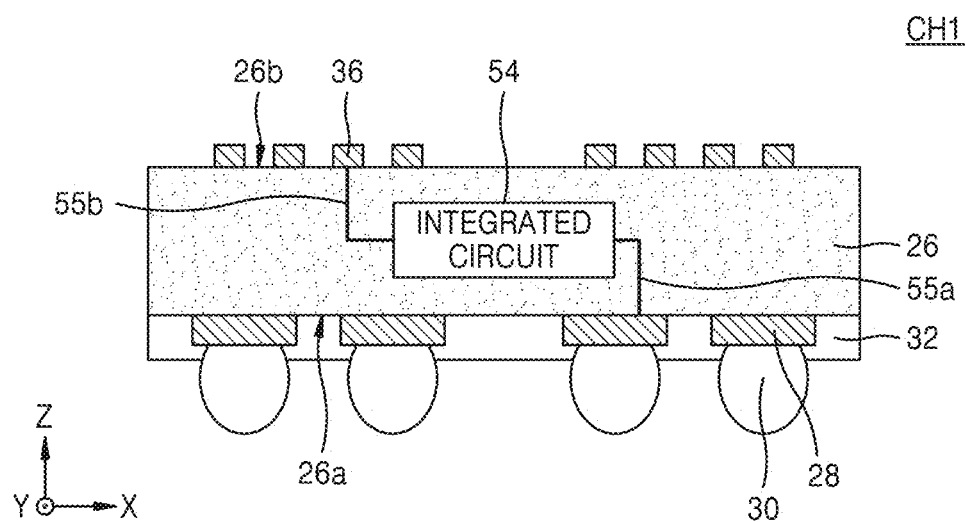
FIG. 15 is a cross-sectional view of a semiconductor chip that may be manufactured through a method of processing a semiconductor wafer, according to the inventive concepts.

FIG. 15 is a cross-sectional view of a semiconductor chip CH1 that may be manufactured through a method of processing a semiconductor wafer of the inventive concepts.

For example, the semiconductor chip CH1 may be manufactured by the device wafer 26 of FIG. 6. In FIG. 15, the same or similar reference numerals as those in FIG. 6 may denote the same or similar members. The semiconductor chip CH1 may include a memory chip or logic chip including an integrated circuit 54.

The integrated circuit 54 may be electrically connected to the first wiring pads 28 formed on the first surface 26a of the device wafer 26 and the solder bumps 30 using a first wiring layer 55a.

The passivation layer 32 may be formed between the first wiring pads 28 on the first surface 26a of the device wafer 26. The integrated circuit 54 may be electrically connected to the second wiring pads 36 formed on the second surface 26b of the device wafer 26 using a second wiring layer 55b.

In example embodiments of the inventive concepts, although the integrated circuit 54 may be electrically connected to the first wiring pads 28 and the second wiring pads 36 using the first wiring layer 55a and the second wiring layer 55b, the integrated circuit 54 may be electrically connected to the first wiring pads 28 and second wiring pads 36 using a through silicon via structure.

Figure 16:
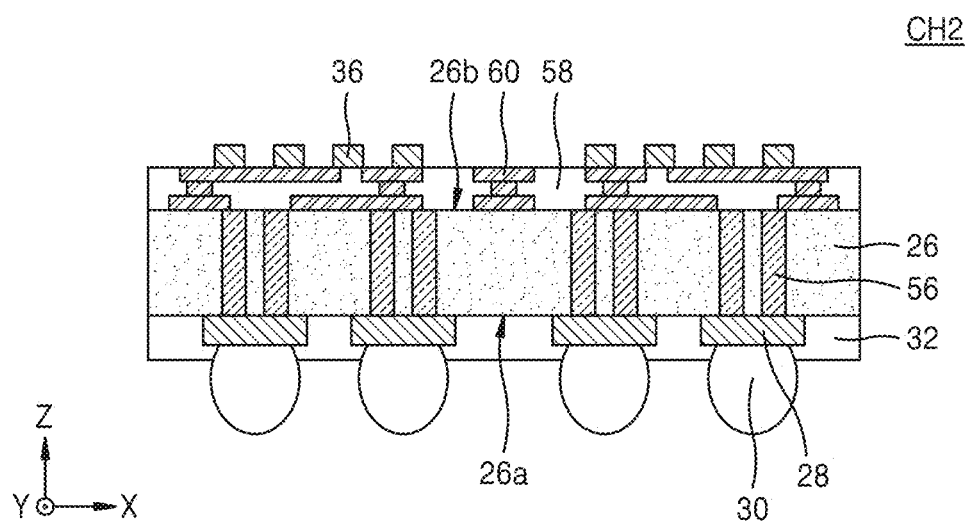
FIG. 16 is a cross-sectional view of a semiconductor chip that may be manufactured through a method of processing a semiconductor wafer, according to the inventive concepts.

FIG. 16 is a cross-sectional view of a semiconductor chip CH2 that may be manufactured through a method of processing a semiconductor wafer of the inventive concepts.

For example, the semiconductor chip CH2 may be manufactured by the device wafer 26 of FIG. 6. In FIG. 16, the same or similar reference numerals as those in FIG. 6 may denote the same or similar members. The semiconductor chip CH2 may include an interposer chip including a through via structure 56, for example, a through silicon via structure. The through via structure 56 may be electrically connected to the first wiring pads 28 formed on the first surface 26a of the device wafer 26 and the solder bumps 30. The passivation layer 32 may be formed between the first wiring pads 28 on the first surface 26a of the device wafer 26.

The through via structure 56 may be electrically connected to the second wiring pads 28 formed on the second surface 26b of the device wafer 26 and a multilayer wiring layer 60. The multilayer wiring layer 60 may be formed in an insulating layer 58 on the second surface 26b of the device wafer 26.

Figure 17:
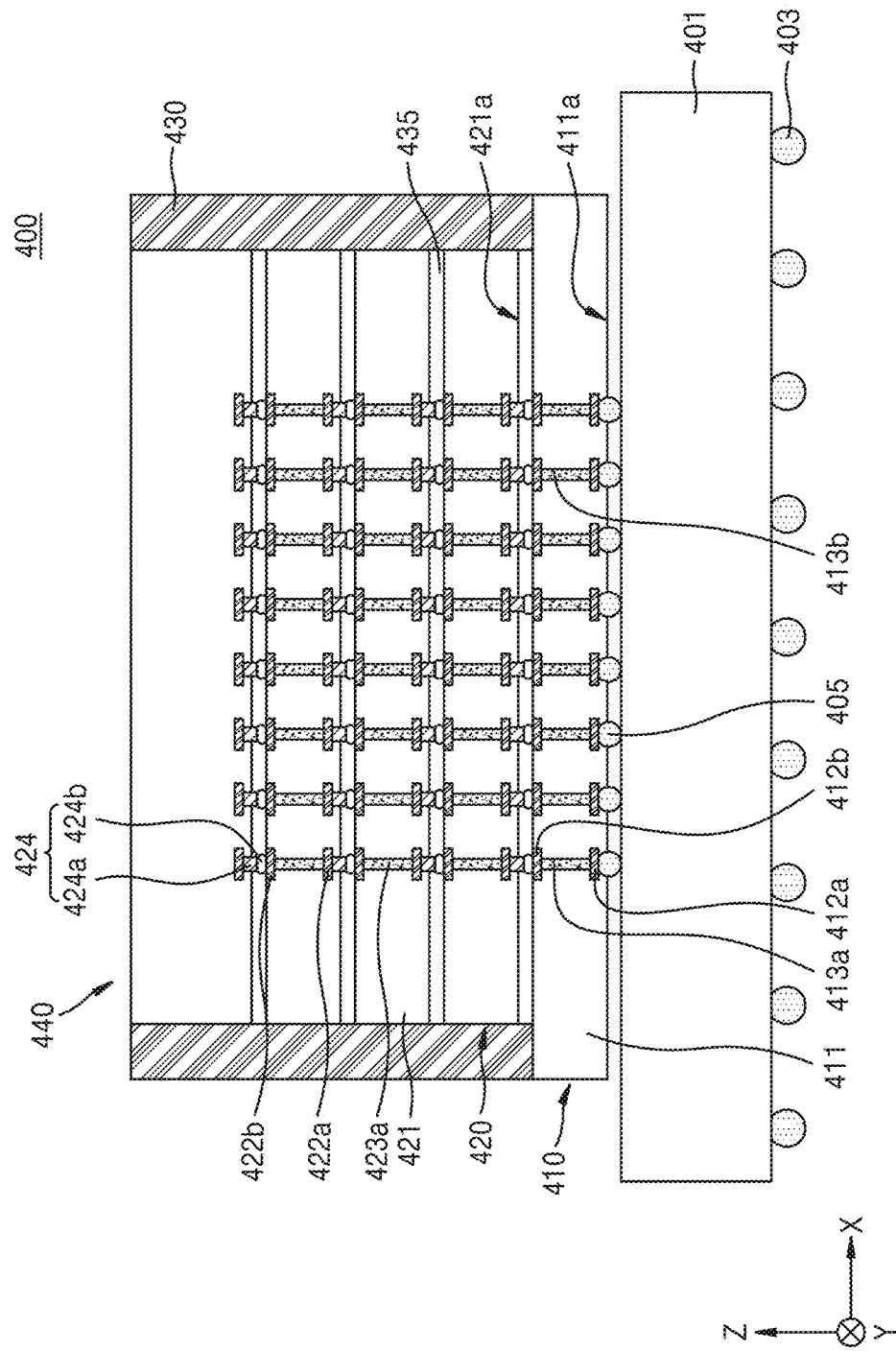
FIG. 17 is a cross-sectional view illustrating a semiconductor package including a semiconductor chip manufactured by the semiconductor wafer processing method according to the inventive concepts.

FIG. 17 is a cross-sectional view illustrating a semiconductor package 400 including semiconductor chips 410 and 420 (hereinafter, also referred to as a first semiconductor chip 410 and a second semiconductor chip 420) manufactured by using the semiconductor wafer processing method according to the inventive concepts.

For example, the semiconductor package 400 may include a stacked semiconductor chip 440 stacked on a package substrate 401. The package substrate 401 may include a printed circuit board (PCB). Solder bumps 403, which are external connection terminals, may be formed on a bottom surface of the package substrate 401.

The stacked semiconductor chip 440 may include a first semiconductor chip 410 and a plurality of second semiconductor chips 420 mounted on the first semiconductor chip 410. The second semiconductor chips 420 may be sequentially stacked on the first semiconductor chip 410 in a vertical direction (a Z direction). A width of the first semiconductor chip 410 may be greater than that of each of the second semiconductor chips 420.

In the drawing, the stacked semiconductor chip 440 is illustrated as including four second semiconductor chips 420 but is not limited thereto. For example, the stacked semiconductor chip 440 may include two or more second semiconductor chips 420. The first semiconductor chip 410 and the second semiconductor chips 420 may include the semiconductor chip CH1 manufactured according to the inventive concepts.

The first semiconductor chip 410 may include a first pad 412a and a second pad 412b on both surfaces of a first semiconductor substrate 411. A first through via structure 413a between the first pad 412a and the second pad 412b may electrically connect the two pads. The first pad 412a may be electrically connected to the package substrate 401 by using solder bumps 405, which are external connection terminals. An active surface 411a of the first semiconductor chip 410 may be located in a lower portion of the first semiconductor chip 410. The first pad 412a may be a top pad. The second pad 412b may be a bottom pad.

Each of the second semiconductor chips 420 may include a third pad 422a and a fourth pad 422b on both surfaces of a second semiconductor substrate 421. A second through via structure 423a between the third pad 422a and the fourth pad 422b may electrically connect the two pads. The third pad 422a may electrically connect the second semiconductor chips 420 by using an internal connection terminal 424. The internal connection terminal 424 may include an internal connection pad 424a and an internal bump 424b.

An active surface 421a may be disposed under each of the second semiconductor chips 420. The third pad 422a may be a top pad. The fourth pad 422b may be a bottom pad. The second semiconductor chips 420 in the stacked semiconductor chip 440 may be bonded by an adhesive layer 435. The second semiconductor chips 420 may be molded by a molding layer 430 on the first semiconductor chip 410.

Figure 18:
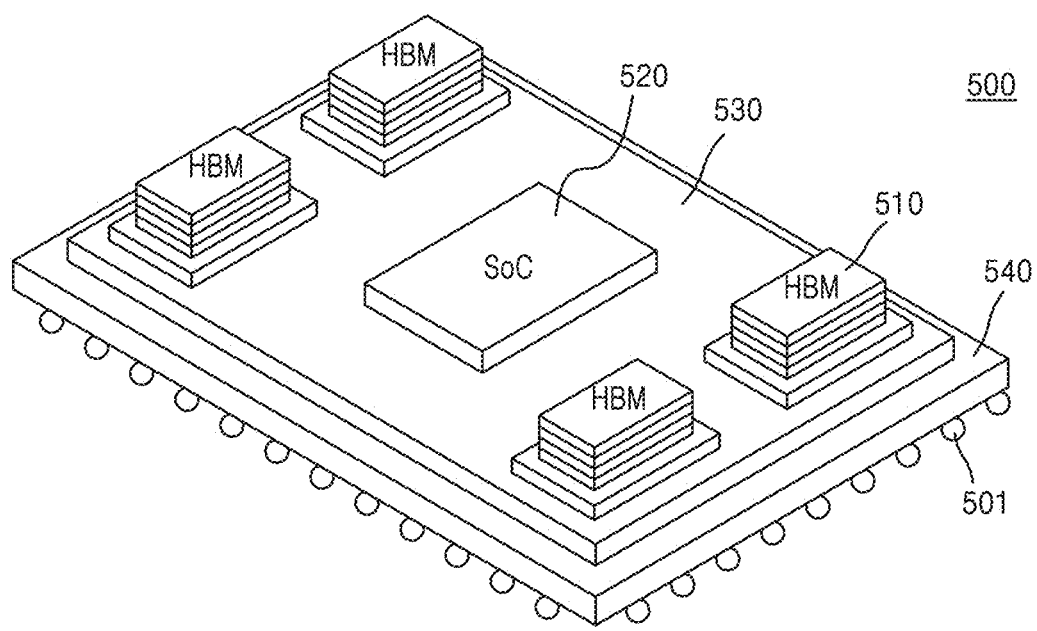
FIGS. 18 and 19 are diagrams illustrating a semiconductor package including a semiconductor chip manufactured by the semiconductor wafer processing method according to the inventive concepts.
Figure 19:
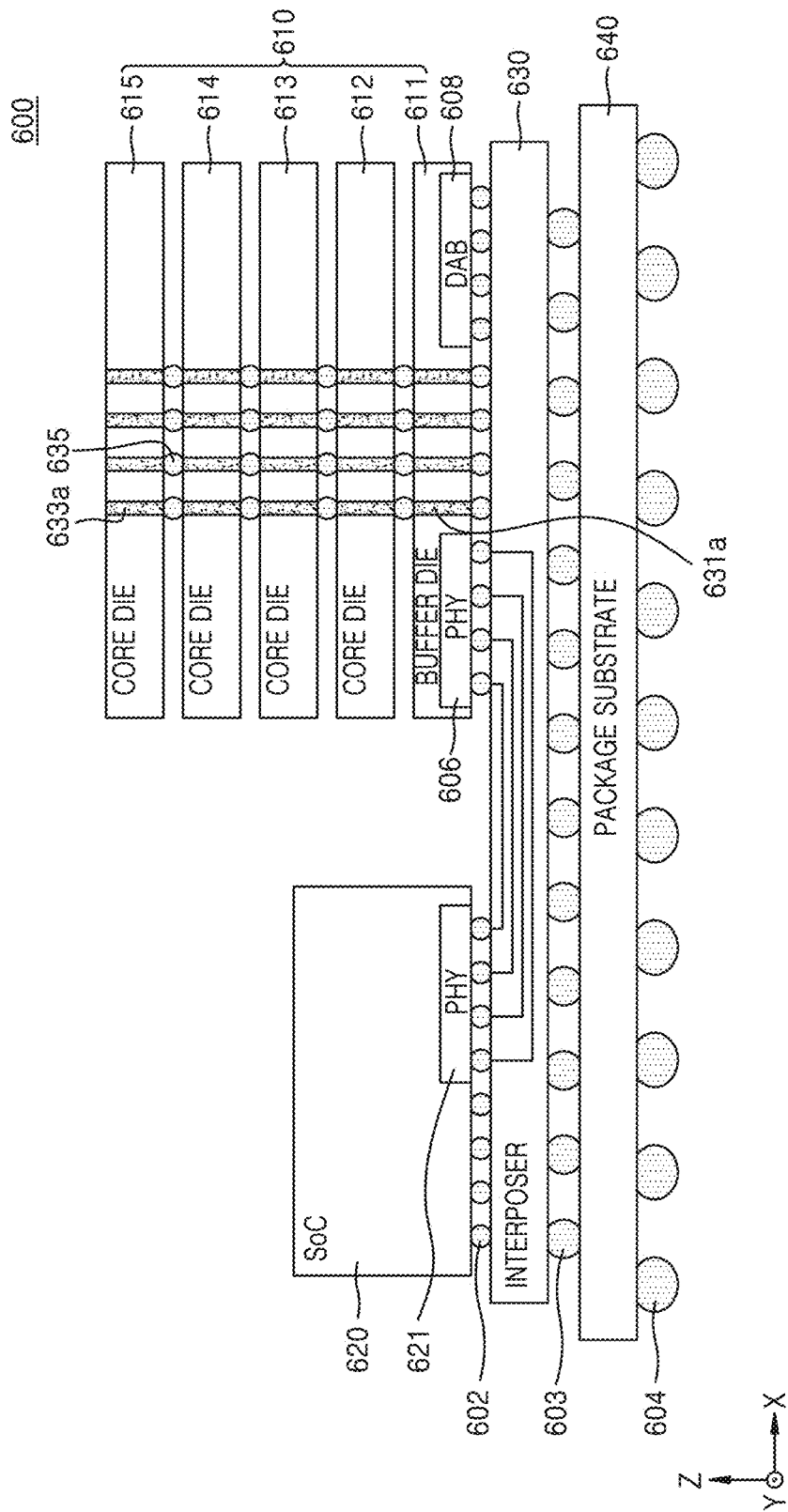

FIGS. 18 and 19 are diagrams illustrating a semiconductor package 500 including a semiconductor chip manufactured by the semiconductor wafer processing method according to the inventive concepts.

Referring to FIG. 18, the semiconductor package 500 may include a plurality of stack type memory chips 510 and a system-on chip (SoC) 520. The stack type memory chips 510 and the SoC 520 may be stacked on an interposer chip 530, and the interposer chip 530 may be stacked on a package substrate 540. The interposer chip 530 may include a semiconductor chip CH2 according to example embodiments of the inventive concepts. The semiconductor package 500 may transfer or receive signals to or from an external package or electronic devices through solder balls 501 attached to a lower portion of the package substrate 540.

Each of the stack type memory chips 510 may be implemented based on high bandwidth memory (HBM) standard. However, the inventive concepts are not limited thereto, and each of the stack type memory chips 510 may be implemented based on graphics double data rate (GDDR), hardware management console (HMC), or Wide I/O standards. Each of the stack type memory chips 510 may include the semiconductor chip CH1 according to example embodiments of the inventive concepts.

The SoC 520 may include at least one processor, such as a central processing unit (CPU), an application processor (AP), a graphics processing unit (GPU), and a neural processing unit (NPU), and a plurality of memory controllers for controlling the plurality of stack type memory chips 510. The SoC 520 may transfer or receive signals to or from a corresponding stack type memory chip through a memory controller.

Referring to FIG. 19, a semiconductor package 600 may include a stack type memory chip 610, an SoC 620, an interposer chip 630, and a package substrate 640. The interposer chip 630 may include the semiconductor chip CH2 according to example embodiments of the inventive concepts. The stack type memory device 610 may include a buffer die 611 and a plurality of core dies 612 to 615. Each of the stack type memory chips 610 may include the semiconductor chip CH1 according to example embodiments of the inventive concepts.

Each of the core dies 612 to 615 may include a plurality of memory cells for storing data. The buffer die 611 may include a physical layer PHY 606 and a direct access region DAB 608. The physical layer PHY 606 may be electrically connected to a physical layer PHY 621 of the SoC 620 through the interposer chip 630. The stack type memory chip 610 may receive signals from the SoC 620 through the physical layer PHY 606, or may transfer signals to the SoC 620.

The direct access region DAB 608 may provide an access path for testing the stack type memory chip 610 without passing through the SoC 620. The direct access region DAB 608 may include a conductive means (for example a port or a pin) for directly communicating with an external test device. A test signal received through the direct access region DAB 608 may be transferred to the core dies 612 to 615 through a plurality of through via structures. Data read from the core dies 612 to 615 so as to test the core dies 612 to 615 may be transferred to the test device through a plurality of through via structures and the direct access region 608. Therefore, a direct access test may be performed on the core dies 612 to 615.

The buffer die 611 and the core dies 612 to 615 may be electrically connected to each other through a plurality of through via structures 631a and 633a (hereinafter, also referred to as first and second through via structures 631a and 633a) and a plurality of bumps 635. The buffer die 611 and the core dies 612 to 615 may include the semiconductor chip CH1 according to example embodiments of the inventive concepts.

For example, the buffer die 611 may include a first through via structure 631a. Each of the core dies 612 to 615 may include a second through via structure 633a. The buffer die 611 may receive signals, respectively provided to channels through the bumps 602 allocated by channel units, from the SoC 620, or may transfer the signals to the SoC 620 through the bumps 602. For example, the bumps 602 may include micro-bumps.

The SoC 620 may execute a plurality of applications supported by the semiconductor package 600 by using the stack type memory chip 610. The SoC 620 may include the semiconductor chip CH1 according to example embodiments of the inventive concepts. The SoC 620 may include at least one processor such as a CPU, an AP, a GPU, an NPU, a tensor processing unit (TPU), a vision processing unit (VPU), an image signal processor (ISP), and a digital signal processor (DSP), and may execute specialized arithmetic operations.

The SoC 620 may control an overall operation of the stack type memory chip 610. The SoC 620 may include the physical layer PHY 621. The PHY 621 may include an interface circuit for transferring or receiving signals to or from the physical layer PHY 606 of the stack type memory chip 610. The SoC 620 may provide various signals to the physical layer PHY 606 through the physical layer PHY 621. The signals provided to the physical layer PHY 606 may be transferred to the core dies 612 to 615 through the through via structures 631a and 633a, and an interface circuit of the physical layer PHY 606.

The interposer chip 630 may connect the stack type memory device 610 to the SoC 620. The interposer chip 630 may connect the physical layer PHY 606 of the stack type memory chip 610 to the physical layer PHY 621 of the SoC 620 and may provide physical paths including conductive materials. Therefore, the stack type memory chip 610 and the SoC 620 may be stacked on the interposer chip 630 and may transfer and receive signals therebetween.

The bumps 603 may be attached on an upper portion of the package substrate 640, and the solder balls 604 may be attached on a lower portion of the package substrate 640. For example, the bumps 603 may include flip-chip bumps. The interposer chip 630 may be stacked on the package substrate 640 through the bumps 603. The semiconductor package 600 may transfer or receive signals to or from an external package or electronic devices through the solder balls 604. For example, the package substrate 640 may include a PCB.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. A debonding tape comprising: a first base layer having a first modulus;
    a first adhesive layer on the first base layer;
    a second base layer on the first adhesive layer and having a second modulus greater than the first modulus;
    an intermediate layer on the second base layer; and
    a second adhesive layer on the intermediate layer.

2. The debonding tape of claim 1, wherein the first base layer includes polyolefin (PO), poly vinyl chloride (PVC), or polyvinyl acetate (PVA), and the second base layer includes polyethylene terephthalate (PET), polyethylene naphthalate (PEN), poly ether ether ketone (PEEK), or polyimide (PI).

3. The debonding tape of claim 1, wherein the first adhesive layer includes an ultraviolet (UV) curable pressure sensitive adhesive (PSA) or a non-UV curable PSA, the second adhesive layer includes a UV curable PSA, and the intermediate layer includes a non-UV curable resin.

4. The debonding tape of claim 1, wherein the first adhesive layer includes an acrylic polymer, a cross-linker, and/or a photo initiator, the second adhesive layer includes an acrylic polymer, a cross-linker, and a photo initiator, and the intermediate layer includes an acrylic polymer and a cross-linker.

5. The debonding tape of claim 1, wherein diameters of the first base layer and the first adhesive layer are greater than diameters of the intermediate layer and the second adhesive layer.

6. The debonding tape of claim 1, wherein a thickness of the intermediate layer is greater than a thickness of the second base layer, and the thickness of the second base layer is less than a thickness of the first base layer.

7. A debonding tape comprising:
    a first tape layer including a first base layer having a first modulus and a first adhesive layer on the first base layer, wherein the first tape layer has a first diameter; and
    a second tape layer on the first tape layer and supporting the first tape layer,
    wherein the second tape layer includes a second base layer on the first adhesive layer and having a second modulus greater than the first modulus, an intermediate layer on the second base layer, and a second adhesive layer on the intermediate layer, wherein the second tape layer has a second diameter smaller than the first diameter such that a circumferential portion of the first tape layer is exposed in a cross-sectional view.

8. The debonding tape of claim 7, wherein a thickness of the first tape layer is less than a thickness of the second tape layer.

9. The debonding tape of claim 7, wherein thicknesses of middle portions of the first tape layer and the second tape layer are greater than thicknesses of peripheral portions of the first tape layer and the second tape layer.

10. The debonding tape of claim 7, wherein the first base layer includes polyolefin (PO), poly vinyl chloride (PVC), or polyvinyl acetate (PVA), and the first adhesive layer includes an ultraviolet (UV) curable pressure sensitive adhesive (PSA) or a non-UV curable PSA.

11. The debonding tape of claim 10, wherein the first adhesive layer includes an acrylic polymer, a cross-linker, and/or a photo initiator.

12. The debonding tape of claim 7, wherein the second base layer includes polyethylene terephthalate (PET), polyethylene naphthalate (PEN), poly ether ether ketone (PEEK), or poly imide (PI), the intermediate layer includes a non-UV curable synthetic resin, and the second adhesive layer includes a UV curable pressure sensitive adhesive (PSA).

13. The debonding tape of claim 12, wherein the intermediate layer includes an acrylic polymer and a cross-linker, and the second adhesive layer includes an acrylic polymer, a cross-linker, and a photo initiator.

14. A method of processing a semiconductor wafer, the method comprising:

preparing a debonding tape including a first tape layer having a first diameter and a second tape layer adhered on the first tape layer and having a second diameter smaller than the first diameter such that a circumferential portion of the first tape layer is exposed in a cross-sectional view, wherein the first tape layer includes a first base layer having a first modulus and a first adhesive layer on the first base layer, the second tape layer includes a second base layer having a second modulus greater than the first modulus, an intermediate layer on the second base layer, and a second adhesive layer on the intermediate layer, wherein the debonding tape is mounted on a ring-shaped frame, and the circumferential portion of the first tape layer is supported by the ring-shaped frame and the second tape layer is in the ring-shaped frame;

after turning over the ring-shaped frame, adhering a device wafer, to which a carrier wafer is adhered by a third adhesive layer, to the second adhesive layer of the debonding tape;

debonding and separating the carrier wafer from the device wafer;

reducing an adhesive force of the debonding tape by exposing the device wafer, to which the debonding tape is adhered, to UV rays;

cutting a circumferential portion of the debonding tape, the circumferential portion surrounding the device wafer;

turning over the device wafer, to which the cut debonding tape is adhered, and attaching the device wafer to a dicing tape; and debonding and separating the cut debonding tape from the device wafer attached to the dicing tape.

15. The method of claim 14, wherein, when adhering the device wafer, to which the carrier wafer is attached, to the second adhesive layer of the debonding tape, a plurality of solder bumps formed on the device wafer are adhered to the second adhesive layer.

16. The method of claim 14, wherein the device wafer, to which the carrier wafer is attached, is adhered to the second adhesive layer of the debonding tape such that the circumferential portion of the first tape layer of the debonding tape is not sunk down.

17. The method of claim 14, wherein the device wafer includes an interposer wafer or a chip wafer.

18. The method of claim 14 further comprising, after debonding and separating the carrier wafer from the device wafer, cleaning the device wafer attached to the debonding tape to remove adhesive materials remaining on the device wafer.

19. The method of claim 14, wherein debonding and separating the carrier wafer from the device wafer includes applying heat to the carrier wafer and the device wafer to reduce an adhesive force of the third adhesive layer.

20. The method of claim 14, wherein the first base layer includes polyolefin (PO), poly vinyl chloride (PVC), or polyvinyl acetate (PVA), and the first adhesive layer includes an ultraviolet (UV) curable pressure sensitive adhesive (PSA) or a non-UV curable PSA, the second base layer includes polyethylene terephthalate (PET), polyethylene naphthalate (PEN), poly ether ether ketone (PEEK), or polyimide (PI), the intermediate layer includes a non-UV curable synthetic resin, and the second adhesive layer includes a UV curable PSA.

* * * * *